United States Patent
Guilford et al.

(10) Patent No.: US 10,528,539 B2
(45) Date of Patent: Jan. 7, 2020

(54) OPTIMIZED SELECTION OF HASH COLLISION CHAINS

(71) Applicant: Intel Corporation, Santa Clara, CA (US)

(72) Inventors: James D. Guilford, Northborough, MA (US); Vinodh Gopal, Westborough, MA (US); Daniel Cutter, Maynard, MA (US)

(73) Assignee: Intel Corporation, Santa Clara, CA (US)

( * ) Notice: Subject to any disclaimer, the term of this patent is extended or adjusted under 35 U.S.C. 154(b) by 476 days.

(21) Appl. No.: 15/200,556

(22) Filed: Jul. 1, 2016

(65) Prior Publication Data

US 2018/0004744 A1    Jan. 4, 2018

(51) Int. Cl.
| | | |
|---|---|---|
| *G06F 17/30* | (2006.01) | |
| *G06F 16/22* | (2019.01) | |
| *G06F 16/2455* | (2019.01) | |
| *G06F 3/06* | (2006.01) | |

(52) U.S. Cl.
CPC ........ *G06F 16/2255* (2019.01); *G06F 3/0604* (2013.01); *G06F 3/0656* (2013.01); *G06F 3/0673* (2013.01); *G06F 16/2455* (2019.01)

(58) Field of Classification Search
CPC .......... G06F 17/3033; G06F 17/30477; G06F 3/0604; G06F 3/0656; G06F 3/0673; G06F 16/2455; G06F 16/2255
See application file for complete search history.

(56) References Cited

U.S. PATENT DOCUMENTS

| | | | | |
|---|---|---|---|---|
| 9,280,609 | B2* | 3/2016 | Liu | G06F 17/30949 |
| 2007/0150497 | A1* | 6/2007 | De La Cruz | H03M 7/3084 |
| 2011/0154169 | A1 | 6/2011 | Gopal et al. | |
| 2013/0054835 | A1* | 2/2013 | Sliger | H04L 69/04 |
| | | | | 709/247 |
| 2014/0223029 | A1* | 8/2014 | Bhaskar | H03M 7/3088 |
| | | | | 709/247 |
| 2016/0048531 | A1 | 2/2016 | Hubris et al. | |
| 2016/0110116 | A1 | 4/2016 | Chen | |
| 2016/0112062 | A1 | 4/2016 | Dalton et al. | |
| 2016/0147750 | A1 | 5/2016 | Blanco et al. | |

OTHER PUBLICATIONS

International Search report and Written Opinion Received, PCT/US2017/039237, dated Oct. 18, 2017, 8 pages.

* cited by examiner

*Primary Examiner* — Huawen A Peng
(74) *Attorney, Agent, or Firm* — Alliance IP, LLC

(57) ABSTRACT

In an example, there is disclosed an apparatus, comprising: a data store comprising a hash table having for at least some rows a hash entry indexed by a hash value, and comprising a hash chain of one or more pointers to a history buffer, and a spill counter; and one or more logic elements, including at least one hardware logic element, comprising a data compressor to: inspect a string0 comprising n bytes at position p in a data file; get the spill counter from a hash entry corresponding to string0; inspect a string1 comprising n bytes at p+k, wherein k is a positive integer; get the spill counter from a hash entry corresponding to string1; determine that the spill counter for string1 is less than the spill counter for string0; and search a chain1 (the hash chain of a hash entry corresponding to string1) for a matching string of size at least n+k with an offset of −k.

40 Claims, 11 Drawing Sheets

| | | |
|---|---|---|
| 604 | //Let N be the current position in the input buffer in [] | |
| 608 | M=0 //Amount of look-ahead for a good chain | |
| 612 | Idx = hash(in[N+2:N]) | |
| 616 | while(bad_chain(Idx))){ | |
| 620 |    M++; | |
| 624 |    Idx = hash(in[M+N+2:M+N) | |
| 628 | } | |
| 632 | Get list of positions to search {P1,P2,…} = walk-chain(Idx); | |
| 636 | Adjust each position in list as Pi = Pi - M | |
| 640 | Find longest string from list of positions that matches string at in[N] with length L. | |
| 644 | If L >= 3 return match of length L for position N (with relative offset N - Pi). (Except for hash aliasing, any match is expected to be at least M+3 in length.) | |
| 648 | Else{ | |
| 652 |    If (M==0) return no match exists for position N | |
| 656 |    Else{ //default back to chain0 with clamped max-len | |
| 660 |       Idx = hash{in[N+2:N] | |
| 664 |       Get list of positions to search {P1,P2…} = walk-chain(Idx) | |
| 668 |       Prune list to few most recent positions, e.g., {P1, … P8} | |
| 672 |       Look for a string of length (M+2) from list that matches string at in[N] | |
| 676 |       If match, return best length for position N (with relative offset N - Pi) | |
| 680 |       Else return no match exists for position N | |
| 685 |    } | |
| 690 | } | |

*Fig. 6*

OPTIMIZED SELECTION OF HASH COLLISION CHAINS

FIELD OF THE SPECIFICATION

This disclosure relates in general to the field of semiconductor devices, and more particularly, though not exclusively to, a system and method for optimized selection of hash collision chains.

BACKGROUND

Many data compressors, such as those based on the LZ77 compression algorithm, perform data compression by replacing repeated data strings in an input data buffer with pointers to prior positions of the repeated strings in the input data buffer. Data compression is achievable because the pointers are typically smaller than the repeated data strings they replace. To find the repeated data strings in an input data buffer, some implementations of such data compressors utilize hash chain matching. In hash chain matching, a hash table is constructed with each entry corresponding to a respective data substring that was found previously in the input data buffer. Each entry of the hash table points to a respective hash chain storing the one or more positions in the input data buffer at which the particular data substring corresponding to the respective hash table entry was found. Data compressors can utilize such hash chains to limit the number of prior positions in the input data buffer to be searched when attempting to find a prior data string that matches and, thus, repeats a current data string beginning at the current position of the input data buffer undergoing compression.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

FIG. 6 illustrate example pseudocode for implementing methods according to embodiments of this specification.

SUMMARY

Figure 1:
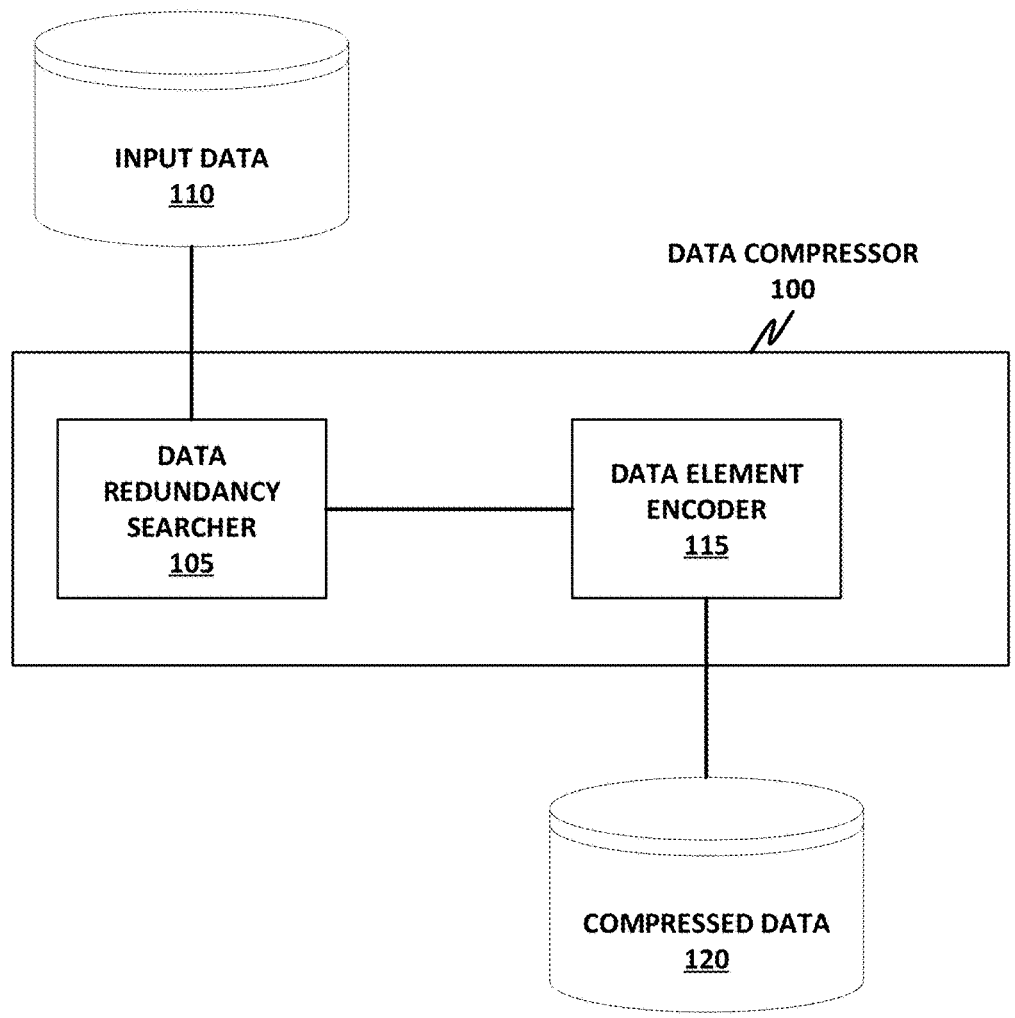
FIG. 1 is a block diagram of an example data compressor including an example data redundancy searcher constructed to perform look-ahead hash chain matching for data compression according to embodiments of this specification.

In an example, there is disclosed an apparatus, comprising: a data store comprising a hash table having for at least some rows a hash entry indexed by a hash value, and comprising a hash chain of one or more pointers to a history buffer, and a spill counter; and one or more logic elements, including at least one hardware logic element, comprising a data compressor to: inspect a string0 comprising n bytes at position p in a data file; get the spill counter from a hash entry corresponding to string0; inspect a string1 comprising n bytes at p+k, wherein k is a positive integer; get the spill counter from a hash entry corresponding to string1; determine that the spill counter for string1 is less than the spill counter for string0; and search a chain1 (the hash chain of a hash entry corresponding to string1) for a matching string of size at least n+k with an offset of −k.

EMBODIMENTS OF THE DISCLOSURE

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

Methods, apparatus, systems and articles of manufacture (e.g., physical storage media) to implement look-ahead hash chain matching for data compression are disclosed herein. Example data compression methods disclosed herein include determining a first hash chain index corresponding to a first position in an input data buffer based on a first group of bytes accessed from the input data buffer beginning at a first look-ahead offset from the first position. Such disclosed example methods also include, in response to determining a first hash chain, which is indexed in memory by the first hash chain index, satisfies a quality condition, searching the input data buffer at respective adjusted buffer positions corresponding to ones of a first set of buffer positions stored in the first hash chain being offset by the first look-ahead offset to find a second string of data bytes matching a first string of data bytes beginning at the first position in the input data buffer. Such disclosed example methods further include, in response to determining the second string of data bytes satisfies a length condition, providing a relative position and a length of the second string of data bytes to an encoder to output compressed data corresponding to the input data buffer.

In some disclosed example methods, the first group of bytes includes a first number of bytes beginning at the first look-ahead offset from the first position. In some such disclosed example methods, the determining of the first hash chain index includes processing the first group of bytes with a hash function to determine the first hash chain index.

Additionally or alternatively, in some disclosed example methods, the first hash chain is determined to satisfy the quality condition when at least one of (i) the first hash chain index is not included in a blacklist of hash chain indices, or (ii) a number of buffer positions stored in the first hash chain satisfies a threshold.

Additionally or alternatively, some disclosed example methods further include subtracting the first look-ahead offset from the ones of the first set of buffer positions stored in the first hash chain to determine the respective adjusted buffer positions.

Additionally or alternatively, in some disclosed example methods, the second string of data bytes satisfies the length condition when the length of the second string of data bytes is greater than or equal to a sum of the first look-ahead offset and a number corresponding to a number of bytes included in the first group of bytes.

Additionally or alternatively, in some disclosed example methods, the length condition is a first length condition. Some such disclosed example methods include, when the first hash chain does not satisfy the quality condition, determining a second hash chain index corresponding to the first position in the input data buffer based on a second group of bytes accessed from the input data buffer beginning at a second look-ahead offset from the first position, with the second look-ahead offset being larger than the first look-ahead offset. Such disclosed example methods also include, in response to determining a second hash chain, which is indexed in memory by the second hash chain index, satisfies the quality condition, searching the input data buffer at respective adjusted buffer positions corresponding to ones of a second set of buffer positions stored in the second hash chain being offset by the second look-ahead offset to find a fourth string of data bytes matching a third string of data bytes beginning at the first position in the input data buffer. Such disclosed example methods further include, in response to determining the fourth string of data bytes satisfies a second length condition, providing a relative position and a length of the fourth string of data bytes to an encoder to output the compressed data corresponding to the input data buffer. In some such examples, the second string of data bytes satisfies the first length condition when the length of the second string of data bytes is greater than or equal to a sum of the first look-ahead offset and a number, the fourth string of data bytes satisfies the second length condition when the length of the fourth string of data bytes is greater than or equal to a sum of the second look-ahead offset and the number, and the number corresponds to a number of bytes included in the first group of bytes and a number of bytes included in the second group of bytes.

Additionally or alternatively, some disclosed example methods include, when the second string of data bytes does not satisfy the first length condition, determining a third hash chain index corresponding to the first position in the input data buffer based on a third group of bytes accessed from the input data buffer beginning at the first position in the input data buffer. Such disclosed example methods also include searching the input data buffer at respective ones of a subset of a third set of buffer positions stored in a third hash chain, which is indexed in memory by the third hash chain index, to find a sixth string of data bytes matching a fifth string of data bytes beginning at the first position in the input data buffer. Such disclosed example methods further include, in response to determining the sixth string of data bytes satisfies a third length condition, providing a relative position and a length of the sixth string of data bytes to an encoder to output the compressed data corresponding to the input data buffer. In some such examples, the sixth string of data bytes satisfies the third length condition when the length of the sixth string of data bytes is between a first number corresponding to a number of bytes included in the third group of bytes and a second number equal to one less than a sum of the first look-ahead offset and the number of bytes included in the third group of bytes. Additionally or alternatively, in some such examples, the subset of the third set of buffer positions stored in the third hash chain corresponds to a first number of buffer positions stored at the beginning of the third hash chain.

These and other example methods, apparatus, systems and articles of manufacture (e.g., physical storage media) to implement look-ahead hash chain matching for data compression are disclosed in greater detail below.

As noted above, many data compressors perform data compression by replacing repeated data strings in an input data buffer with one version of the data string and pointers to prior positions of the other repeated strings in the input data buffer. Some such data compressors further utilize hash chain matching to reduce the number of prior positions in the input data buffer to be searched when attempting to find a prior data string that matches and, thus, repeats a current data string beginning at a current position of the input data buffer undergoing compression. However, string searching based on hash chain matching can still be time consuming if a particular hash chain to be searched is long, which can occur for hash chains corresponding to data substrings that are popular or otherwise likely to occur repeatedly in the input data buffer. Prior data compressors typically do not provide any mechanism to avoid searching such long or, in other words, bad hash chains.

Example methods, apparatus, systems and articles of manufacture (e.g., physical storage media) disclosed herein implement look-ahead hash chain matching for data compression, which provides technical solutions to the technical problems associated with the searching of bad hash chains that plague prior data compressors. When attempting to find a prior data string that matches a current data string beginning at a current position of the input data buffer undergoing compression, prior data compressors are unable to avoid searching bad hash chains. This is because the prior data compressors are limited to using a substring formed from a group of data bytes beginning at the current input buffer position to select the hash chain to be searched. Unlike such prior data compressors, disclosed example data compressors utilizing look-ahead hash chain matching are able to avoid searching bad hash chains by using a substring formed from a group of data bytes beginning at a look-ahead offset from the current position of the input data buffer to select the hash chain to be searched for finding a prior data string matching a current data string beginning at the current input buffer position.

As disclosed in further detail below, example data compressors utilizing look-ahead hash chain matching as disclosed herein are able to adjust the look-ahead offset until the hash chain index formed from the group of data bytes beginning at the look-ahead offset from the current input buffer position corresponds to a hash chain that is not a bad hash chain. Examples of distinguishing between good and bad hash chains are disclosed in further detail below. However, the resulting hash chain indexed by this look-ahead hash chain index does not correspond to the group of data bytes beginning at the current input buffer position but, instead, corresponds to the group of data bytes beginning at the look-ahead offset from the current input buffer position. Accordingly, example data compressors utilizing look-ahead hash chain matching as disclosed herein adjust the buffer positions stored in the selected hash chain by the look-ahead offset, as disclosed in further detail below, to determine the input buffer positions to be searched for a prior data string (e.g., a longest prior data string) matching a current data string beginning at the current input buffer position undergoing compression. By avoiding searching potentially bad hash chains, example data compressors utilizing look-ahead hash chain matching as disclosed herein can achieve substantial reductions in processor cycles and/or substantial increases in data throughput relative to prior data compressors.

There are also disclosed in this specification optimizations to selection of hash chain collisions. These may improve the performance and compression ratio of compression schemes such as LZ77. In one embodiment, a compressor employs a "chain-select" optimization. In this optimization, the compressor avoids walking through very long chains, such as those that often occur with very common English words. For example, "the" is the most commonly-used word in the English language. Thus, it will be expected to have a very long hash collision chain. However, "them," which fully incorporates "the" may be expected to have a much shorter hash collision chain. Thus, it may be more efficient to search for "hem," and then "look back" one character to pick up the string "them."

In embodiments of LZ77 compression, an objective may be to find the longest sting from history that matches the current location's string in the input buffer. The 3-byte prefix of a current string is hashed, and is then indexed to a hash table, which may contain a "hash collision" chain of previous locations with a matching hash (i.e., the collision chain of that hash index). (Note that the matching hash may or may not represent a matching string.) This chain may be referred to herein as "chain0". Note that a three-byte match index is used herein by way of illustrative example. But in the general case, the index may be any usable minimum match length.

If chain0 is found to be a long chain, then as an optimization, the next 3-byte prefix may be used in its place. This constitutes, essentially, looking ahead by one position in the input buffer. The hash collision chain for this value may then be searched. If that chain is substantially shorter than chain0, then the compressor may use chain1's list of positions (decremented by 1) and compare with the current location string, looking for a match of at least four characters. In the case of such a match, the compressor is done with that prefix, since any 4-byte or longer match at the current position necessarily incorporates any 3-byte match for chain0.

In the case that no match is found of greater than or equal to four bytes, the compressor reverts back to chain0 and searches for matches. But the compressor already knows that there is no 4-byte or greater match, because if there were, it would have been found in the previous operation. So the compressor need not search the long chain for a "best" or "longest" match, but rather can stop as soon as it finds a 3-byte match, which is now known to be the best available match. In some examples, the compressor may also employ heuristics to prune the list to a very small number of locations to search, such as four or eight locations, since the compressor may be looking only for a minimum length (or very small) match when it reverts to chain0. That is, since the compressor knows that there are no 4-byte matches, it is looking only for 3-byte matches, and it is likely (even if not certain) that the first 3-byte match will appear near the beginning of the list if one exists at all.

Considering also the case where chain1 is also found to be unacceptably long, the compressor may proceed to a chain2, decrementing its collision chain locations by two, and looking for matches of length greater than or equal to 5.

In a generalized case, a chain is considered "bad" if it is long, and "good" if it is short. The compressor may predict a bad index at current position N, find the next good index at N+M, search that chain for a match of at least length M+3. If the compressor finds a good match, it is done with the chain, else default back to position N chain with a good-enough match-value of M+2.

This optimized approach may be stated in pseudocode as follows:

```
// Let N be the current position in the input buffer in[ ]
M= 0 // amount of skip ahead for good chain
Idx = hash(in[N+2:N])
while (bad-chain(Idx)){
    M++;
    Idx = hash(in[M+N+2:M+N])
}
Get list of positions to search {P1, P2, ...} = walk-chain(Idx)
Adjust each position in list as Pi = Pi - M
Find the longest string from list of positions that matches
    string at in[N] with length L.
If L >= 3 return match of length L for position N (with relative
    offset N - Pi). (Note that barring hash aliasing, we
    would expect any match to be at least M+3 in length.)
Else {
    If (M ==0) return no match exists for position N
        Else { // default back to chain0 with clamped max-
        length
        Idx = hash(in[N+2:N])
        Get list of positions to search {P1, P2, ...} = walk-
        chain(Idx)
        Prune list to few most-recent positions, e.g.
        {P1,...P8}
        Look for a string of length (M+2) from list that
        matches string at in[N]
        If match return best length for position N (with
        relative offset N - Pi)
        Else return no match exists for position N
    }
}
```

This specification particularly discloses methods of determining the "goodness" of a chain, and implementing chain-select in hardware implementations. Note, however, that these consideration may also apply equally to software implementations with similar data structures, especially if a system designer chooses to optimize the memory footprint (for example, to improve L1$ locality).

In an example, it is assumed that there is no a priori knowledge of the type of content that being compressed (e.g., it may be English text, foreign language text, or a binary file such as an executable or a bitmap). This specification further includes methods of determining if chain-select is working well, based on content type. Where necessary, chain-select may be adjusted or disabled in a fully automated way.

There is disclosed in one example an LZ77 Compression implementation that uses wide/parallel data structures to hold locations/pointers to search. In hardware, there may be large records that contain many pointers (e.g., ~20 or more each). In each record of the hash table, there is a 9-bit field that is used as a "spill counter."

During the hash-update operation, every time a hash table entry becomes full, the compressor creates a spill entry in the spill table belonging to this hash chain, thus creating space in the hash entry. The compressor also increments the spill count value in the hash table entry. This count becomes an estimate of how long the spill chain is. A small count is an indication of a "good" chain, while a long count is an indication of a "bad" chain.

During the searching operation, when the compressor fetches the hash-table entry for the current "position," it also fetches (on the next cycle), the hash-table entries for "position+1," and possibly "position+2." The compressor then selects the entry with the smallest spill-count (i.e., the most "good" chain) as the entry to process next. As explained above, these chains may be referred to as "chain0," "chain1," and "chain2." The chain with the smallest spill count may then be used. In one embodiment, as a further optimization, the selection is slightly biased toward chain0. In this case, chain1 or chain2 is selected only if it is at least two better than chain0 (e.g., if the spill count for chain0 is five, and the spill count for chain1 is 4, chain0 is used.) Furthermore, if the compressor selects chain1 or chain2, it still remembers chain0, in case it is needed.

When the compressor is walking a chain that is either chain1 or chain2, and it gets to the end of the chain without finding a valid match, rather than going on to the next position, it starts to follow the associated chain0, but with one or more flags that indicate that it should stop if it finds a 3-byte match (if it had been following chain1) or a 4-byte match (if it had been following chain2).

A system and method for optimized selection of hash collision chains will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a block diagram of an example data compressor 100 including an example data redundancy searcher 105 constructed to perform look-ahead hash chain matching ("chain-select") for data compression in accordance with the teachings of this disclosure is illustrated in FIG. 1. The example data compressor 100 of FIG. 1 implements data compression, such as any data compression algorithm based on LZ77 compression, by searching for and replacing repeated data strings in an input data buffer with pointers to prior positions of the repeated strings in the input data buffer. For example, the structure of the example data compressor 100 of FIG. 1 is compatible with the DEFLATE compression algorithm as specified by the Internet Engineering Task Force (IETF) in RFC 1951. DEFLATE compression utilizes a combination of an LZ77 compression algorithm to find repeated strings in an input data buffer, and Huffman coding to code the data elements output by the LZ77 compression algorithm.

Accordingly, the example data compressor 100 of FIG. 1 includes the example data redundancy searcher 105 to search for and replace repeated data strings in an example input data buffer 110 with pointers to prior positions of the repeated strings in the input data buffer 110. As such, in some examples, the data redundancy searcher 105 can be used to implement the LZ77 compression portion of the DEFLATE compression algorithm. In the illustrated example of FIG. 1, the data compressor 100 also includes an example data element encoder 115 to encode the data elements determined by the example data redundancy searcher 105 for outputting to an example compressed data buffer 120 corresponding to the example input data buffer 110. As such, in some examples, the data element encoder 115 can be used to implement the Huffman coding portion of the DEFLATE compression algorithm.

As noted above, the data redundancy searcher 105 searches for repeated data strings in the input data buffer 110 and replaces the repeated strings with pointers to prior positions of the repeated strings in the input data buffer 110. In some examples, a given pointer for a given repeated data string corresponding to a current string at the current input buffer position being compressed includes a length of the repeated data string and a relative position (e.g., a relative, backwards distance or offset) from the current input buffer position back to the starting point of the repeated data string in the input data buffer 110. Thus, the pointer to the given repeated data string may be represented as a data pair <length, relative position>. The DEFLATE compression algorithm restricts the relative positions to be no more than 32 Kbytes, and the lengths to be no more than 258 bytes.

If the data redundancy searcher 105 of the illustrated example finds a prior repeated data string for the current input buffer position, the data redundancy searcher 105 outputs the pointer (e.g., the data pair <length, relative position>) for the repeated data string and then advances the current position of the input buffer that is to undergo compression by the length of the repeated data string. However, if the data redundancy searcher 105 of the illustrated example does not find a repeated prior data string for the current input buffer position, the data redundancy searcher 105 outputs one or more literal bytes containing the actual byte(s) of data at the current input buffer position being compressed, and advances the current position of the input buffer that is to undergo compression by the number of literal bytes that were output (e.g., by 1 or some other value).

Thus, the data elements output by the example data redundancy searcher 105 of FIG. 1 include (i) literal bytes and (ii) pointers (e.g., data pairs having the form <length, relative position>) for repeated data strings. The example data element encoder 115 of FIG. 1 encodes the literal bytes and repeated string pointers output by the data redundancy searcher 105 for inclusion in the output compressed data buffer 120 corresponding to the input data buffer 110. For example, to implement the DEFLATE compression algorithm, the data element encoder 115 can encode the data elements (e.g., the literal bytes and repeated string pointers) output by the data redundancy searcher 105 using Huffman coding to further reduce the size of the output compressed data buffer 120 (e.g., in addition to the data size reduction achieved by the repeated string matching and replacement performed by the data redundancy searcher 105).

In the illustrated example of FIG. 1, the data redundancy searcher 105 maintains a hash chain data structure to facilitate searching for repeated data strings in the input data buffer 110. In some examples, the hash chain data structure maintained by the data redundancy searcher 105 includes respective hash chains storing the prior positions in the input data buffer 110 for each three (3) byte substring found in the input data buffer 110. In some examples, each 3-byte substring found in the input data buffer 110 forms a 3-byte prefix that is used to index into a hash table containing pointers to the respective hash chains being maintained by the data redundancy searcher 105. Although 3-byte substrings/prefixes are utilized by the data redundancy searcher 105 of the illustrated example, substrings/prefixes of any length (e.g., 2 bytes, 4 bytes, etc.) could alternatively be used.

Figure 7:
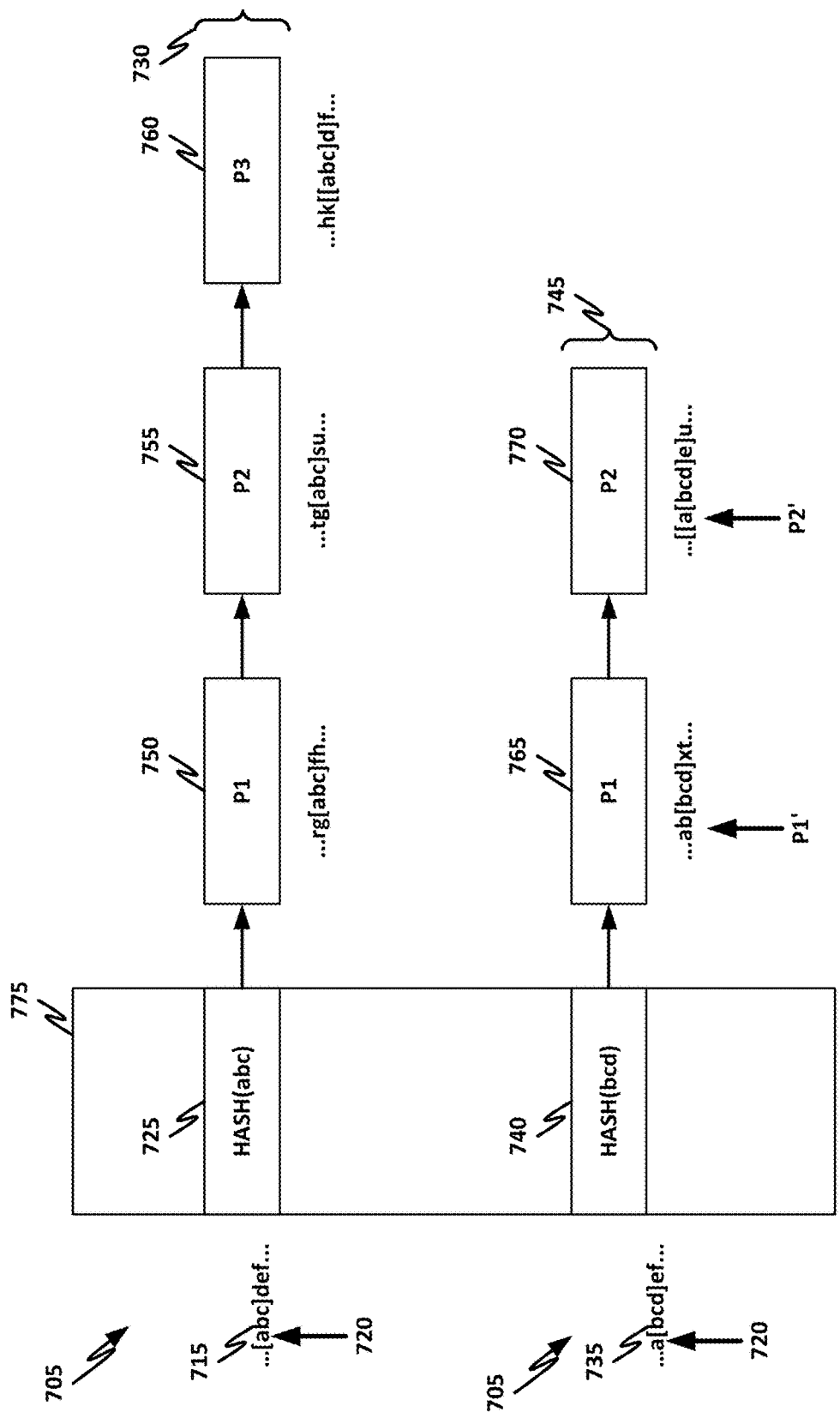
FIG. 7 illustrates example look-ahead hash chain matching operations according to embodiments of this specification.

For example, the hash chain data structure maintained by the data redundancy searcher 105 can include a hash table, which may be an array of entries or records comprising pointers to a history buffer. The array may be accessed by using the current 3-byte substring/prefix as an index. Each entry comprises a pointer to a history buffer for the 3-byte substring/prefix currently found in the input data buffer 110. To reduce the size of the hash table, in some examples, the 3-byte substrings/prefixes are hashed with a hashing function to reduce the size of the hash chain indices from 3×8=24 bits to a fewer number of bits (e.g., 8 bits, 10 bits, 12 bits, or some other value), thereby reducing the size of the hash table to be maintained by the data redundancy searcher 105. For each hash chain index stored in the hash table, the hash table also includes a pointer, in memory, to the corresponding hash chain, which is indexed by that hash chain index. In some examples, the hash chains are implemented by linked lists or any other appropriate data structure. An example hash chain data structure capable of being maintained by the example data redundancy searcher 105 is illustrated in FIG. 7, which is described in further detail below.

The history buffer is a subset of the input data buffer (e.g., the most recent X kb of the input data buffer). This may be physically the same as the input buffer, or if that buffer is not always available, it may be a copy of the input data buffer.

In prior hash chain matching implementations, hash chain processing proceeds as follows. When performing compression of data beginning at the current input buffer position, a prior data compressor accesses the next 3-byte substring/prefix beginning at the current input buffer position, hashes the 3-byte substring/prefix to obtain the corresponding hash chain index, and accesses the particular hash chain indexed by that hash chain index. Then, the prior data compressor searches the input data buffer at the prior positions stored in the hash chain to find the longest prior string that matches a data string beginning at the current input buffer position (and, thus, starting with the 3-byte substring/prefix corresponding to the selected hash chain). However, as noted above, some hash chains may be bad hash chains or, in other words, hash chains that are prone to be long. Longer hash chains take longer to process than shorter hash chains. As such, prior compression techniques attempt to reduce the length of hash chains by, for example, specifying a maximum hash chain length (e.g., 4, 8, 16, 32, 128, 256, 1024, 4096, etc., or some other number of entries) and/or specifying a threshold matching string length (e.g., 8, 16, 32, 128, 258, etc., or some other number of bytes) which, if met, terminates processing of the hash chain. Although such prior techniques can reduce the impact of a bad chain on compression processing, such techniques do not provide a mechanism to avoid bad hash chains altogether.

In contrast with such prior hash chain matching implementations, the data redundancy searcher 105 of the illustrated example implements look-ahead hash chain matching in accordance with the teachings of this disclosure. Look-ahead hash chain matching, as disclosed herein, avoids bad hash chains by "looking-ahead" from the current input buffer position undergoing compression by a look-ahead offset to find a 3-byte substring/prefix that does not correspond to a bad hash chain. Once a look-ahead offset yielding an acceptable hash chain is identified, the data redundancy searcher 105 searches the input data buffer 110 at the prior positions stored in the selected hash chain, after adjusting the stored buffer positions to compensate for the look-ahead offset, to find the longest repeated data string matching a string beginning at the current input buffer position. In some examples, if an acceptable hash chain is not identified, the data redundancy searcher 105 defaults to searching the hash chain corresponding to a look-ahead offset of 0 (or, in other words, corresponding to no look-ahead offset).

By way of example, consider a scenario in which the input data buffer 110 corresponds to English text. In English text, words such as "the" and "and" occur frequently. As such, the 3-byte substrings/prefixes "_th", "the", "he_", "_an", "and" and "nd_" (where "_" represents a space) may appear many times in the input data buffer 110. Accordingly, the hash chains corresponding to these 3-byte substrings/prefixes are likely to be long and, thus, are considered to correspond to bad chains in this example.

Next, assume that, in this example, the current input buffer position undergoing compression begins with the string "_them_". Prior hash chain matching implementations would simply use the initial 3-byte substring/prefix, namely, "_th", and search the buffer positions stored in the hash chain for this 3-byte substring/prefix to find the longest prior repeated data string matching a string beginning at the current input buffer position. However, "_th" is associated with a bad hash chain and, thus, may be time consuming to process.

In contrast with such prior hash chain matching implementations, the data redundancy searcher 105 implements look-ahead hash chain matching to avoid this bad hash chain. For example, the data redundancy searcher 105 continues to look-ahead from the current input buffer position by a look-ahead offset to find a 3-byte substring/prefix corresponding to a hash chain that is not a bad hash chain. In the preceding example, the data redundancy searcher 105 could use a look-ahead offset of 2 bytes to select the 3-byte substring/prefix "hem", instead of the 3-byte substrings/prefixes "_th" or "the", for hash chain matching. However, the prior positions stored in the selected hash chain point to locations where strings starting with "hem" are located in the input data buffer 110. To properly compare the data string beginning at the current input buffer position with the data strings located at the prior positions stored in the selected hash chain, the data redundancy searcher 105 adjusts the stored positions by the look-ahead offset (e.g., by subtracting two bytes from each of the stored positions, in this example) such that the adjusted buffer positions point to locations where strings of the form "**hem" are located in the input data buffer 110 (where "*" refers to an unknown data value), which are aligned with the input string "_them" corresponding to the current input buffer position.

In such an example, the data redundancy searcher 105 searches the adjusted buffer positions determined for the hash chain corresponding to the 3-byte substring/prefix "hem" to find the longest prior repeated data string matching a data string beginning at the current input buffer position. Notably, in this example, the length of the matching prior repeated data string can be no fewer than 5 bytes, which corresponds to the length of the substring/prefix (e.g., 3 bytes in this example) used to index the hash chain, plus the look-ahead offset (e.g., 2 bytes in this example) used to skip ahead to the acceptable hash chain.

More generally, the example data redundancy searcher 105 performs look-ahead hash chain matching for data compression as follows. To find a prior repeated data string (e.g., a longest, prior repeated data string) matching a string beginning at the current input buffer position, the data redundancy searcher 105 uses the 3-byte substring/prefix beginning at the current input buffer position to generate a hash chain index, which is used to select the particular hash chain to be searched. This hash chain is referred to herein as "chain0" as it corresponds to a look-ahead offset equal to 0.

If the example data redundancy searcher 105 determines that chain0 corresponds to a bad chain (e.g., based on a blacklist, a chain size, etc., as described in further detail below), the data redundancy searcher 105 increments the look-ahead offset by, for example, 1 position (e.g., 1 byte). The example data redundancy searcher 105 then uses the 3-byte substring/prefix beginning at this look-ahead offset from the current input buffer position to generate a new hash chain index, which is used to select another hash chain to be searched. This hash chain is referred to herein as "chain1" as it corresponds to a look-ahead offset equal to 1. If the example data redundancy searcher 105 determines that chain1 does not correspond to a bad chain (or, in other words, corresponds to a good chain), the data redundancy searcher 105 searches the input data buffer 110 at the prior positions stored in chain1, after adjusting the stored positions by the look-ahead offset (e.g., by subtracting 1 byte from each prior position), to find a repeated data string having a length of at least 4 bytes (e.g., corresponding to the substring/prefix size plus the look-ahead offset) that matches a data string beginning at the current input buffer position. In some examples, the data redundancy searcher 105 searches the input data buffer 110 at the adjusted prior positions from chain1 to find the longest matching prior string. In some examples, the data redundancy searcher 105 searches the input data buffer 110 at the adjusted prior positions from chain1 to find the first matching prior string having a length of at least 4 bytes. In some examples, the data redundancy searcher 105 searches the input data buffer 110 at a first subset (e.g., a specified maximum number) of the adjusted prior positions from chain1 to find the longest matching prior string having a length of at least 4 bytes from among that subset of prior positions stored in chain1.

In some examples, if the data redundancy searcher 105 does not find a repeated data string having a length of at least 4 bytes after searching the adjusted prior positions from chain1, the data redundancy searcher 105 reverts to searches the input data buffer 110 at the prior positions stored in chain 0. However, in such examples, the data redundancy searcher 105 can stop searching after finding the first repeated data string having a length of 3 bytes, as there are no matching repeated data strings having a length of 4 or more bytes because the search associated with chain1 was unsuccessful. Because of this, in some examples, the data redundancy searcher 105 limits its search of chain 0 to just a subset of the prior positions (e.g., such as the first 4 positions, the first 8 positions, etc.) stored in chain0).

In some examples, if the example data redundancy searcher 105 determines that chain1 corresponds to a bad chain (e.g., based on a blacklist, a chain size, etc., as described in further detail below), the data redundancy searcher 105 again increments the look-ahead offset by, for example, 1 position (e.g., 1 byte), such that the look-ahead offset is now 2 bytes. The example data redundancy searcher 105 then uses the 3-byte substring/prefix beginning at this look-ahead offset from the current input buffer position to generate a new hash chain index, which is used to select another hash chain to be searched. This hash chain is referred to herein as "chain2" as it corresponds to a look-ahead offset equal to 2. If the example data redundancy searcher 105 determines that chain2 does not correspond to a bad chain (or, in other words, corresponds to a good chain), the data redundancy searcher 105 searches the input data buffer 110 at the prior positions stored in chain 2, after adjusting the stored positions by the look-ahead offset (e.g., by subtracting 2 bytes from each prior position), to find a repeated data string having a length of at least 5 bytes (e.g., corresponding to the substring/prefix size plus the look-ahead offset) that matches a data string beginning at the current input buffer position. However, if the example data redundancy searcher 105 determines that chain2 corresponds to a bad chain, the example data redundancy searcher 105 again increments the look-ahead offset by, for example, 1 position (e.g., 1 byte), such that the look-ahead offset is 3 bytes, and repeats the foregoing process.

In some examples, the example data redundancy searcher 105 continues to increment the look-ahead offset until a good hash chain is indexed by the substring/prefix at the look-ahead offset from the current input buffer position, or a threshold (e.g., maximum) look-ahead offset is reached. In some examples, if a matching repeated data string is not found in the input data buffer 110 at the prior positions (after adjustment by the look-ahead offset) stored in a good hash chain, or the threshold (e.g., maximum) look-ahead offset is reached, the example data redundancy searcher 105 defaults to decrementing the look-ahead offset by, for example, 1 position and searching the hash chain corresponding to the decremented look-ahead offset, even though that hash chain was determined to be a bad hash chain previously. Thus, in such examples, the data redundancy searcher 105 defaults to processing bad hash chains only after exhausting its attempts to search a good hash chain for a matching prior repeated data string. In some examples, if a matching repeated data string is still not found at the prior positions (after adjustment by the look-ahead offset) stored in the hash chain corresponding to the decremented look-ahead offset, the example data redundancy searcher 105 repeats the foregoing process of decrementing the look-ahead offset until the matching repeated data string is found, or the look-ahead offset returns to zero. Then, if a matching repeated data string is still not found at the prior positions of the input data buffer 110 stored in the hash chain corresponding to a look-ahead offset of 0 (e.g., chain0), the example data redundancy searcher 105 determines the a matching repeated data string corresponding to a string beginning at the current input buffer position does not exist.

The example data compressor 100 of FIG. 1 is structured to process any type of input data. Accordingly, the example input data buffer 110 employs any appropriate data structure(s), data format(s), etc., to store any one or more types of input data to be compressed, such as, for example, text (e.g., alphanumeric) data (e.g., corresponding to any language), multimedia data (e.g., audio data, video data, image data, etc.), binary data (e.g., corresponding to any file format), etc. In the illustrated example, the example compressed data buffer 120 employs any appropriate data structure(s), data format(s), etc., to store compressed data corresponding to the type(s) of input data stored in the input data buffer 110. The example input data buffer 110 and/or the example compressed data buffer 120 can be stored in any type(s) and/or number of memories, storage devices, etc., such as the example mass storage device 828 and/or the example volatile memory 814 in the example processor platform 800 of FIG. 8, which is described in further detail below.

In some examples, the data compressor 100 of FIG. 1 is implemented as a stand-alone data compression device (e.g., for inclusion in a data transmission system, such as a video transmission system, a wireless data transmission system, etc.) In some examples, the data compressor 100 of FIG. 1 is integrated into another device, system, etc. (e.g., such as a web server, a mobile device, a personal computer, a computer processor, etc.).

Although the illustrated example data compressor 100 of FIG. 1 is described from the perspective of implementing the DEFLATE compression algorithm, look-ahead hash chain matching for data compression as disclosed herein is not limited thereto. On the contrary, look-ahead hash chain matching for data compression, as disclosed herein, can be used with any compression algorithm that searches the input data being compressed for matching prior repeated data strings. As such, the example data compressor 100 of FIG. 1 can be used to implement other compression algorithms in addition to, or as an alternative to, the DEFLATE compression algorithm. Examples of such data compression algorithms include, but are not limited to, LZ77, LZO, LZF, LZ4, QuickLZ, FastLZ, Google's® Snappy algorithm, etc.

Figure 2:
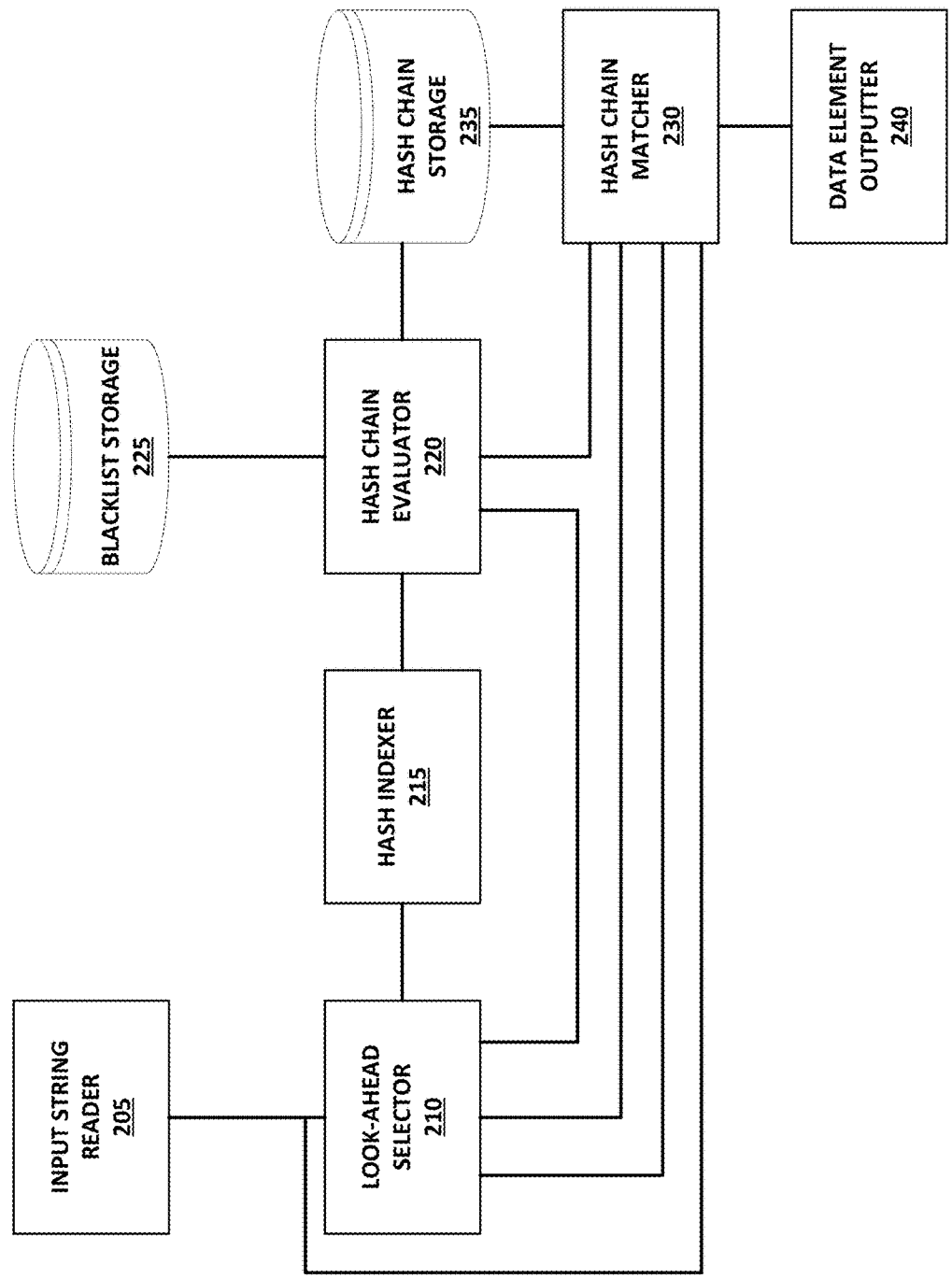
FIG. 2 is a block diagram of an example implementation of a redundancy searcher according to embodiments of this specification.

A block diagram illustrating an example implementation of the data redundancy searcher 105 of FIG. 1 is illustrated in FIG. 2. Operation of the example data redundancy searcher 105 of FIG. 2 is illustrated by way of example in FIG. 7. The example data redundancy searcher 105 of FIG. 2 includes an example input string reader 205 to access the example input data buffer 110 and read data strings beginning at a current input buffer position maintained by the input string reader 205. For example, the input string reader 205 may be structured to read data formatted as 1 byte (8 bit) chunks corresponding to alphanumeric characters, and/or formatted into smaller chunks, larger chunks, etc. After a compression cycle, the input string reader 205 of the illustrated example is responsible for incrementing the current input buffer position (e.g., by the length of the matching prior repeated string or by the number of literals output if no matching string is found) to the next input buffer position to undergo compression.

The example data redundancy searcher 105 of FIG. 2 also includes an example look-ahead selector 210 to select the look-ahead offset to be used by the data redundancy searcher 105 to select the hash chain to be searched for a prior repeated data string that matches a data string beginning at the current input buffer position. In some examples, the look-ahead selector 210 begins with a look-ahead offset of 0, and increments the look-ahead offset until a hash index formed from a substring/prefix beginning at the look-ahead offset from the current input buffer position indexes (e.g., points to) a good hash chain, or a threshold (e.g., maximum) look-ahead offset is reached. In some examples, if a good hash chain is not found (e.g., when the threshold look-ahead offset is reached), or a search of the input data buffer 110 at the positions stored in a selected good hash chain (after adjustment by the look-ahead offset) does not yield a matching prior repeated data string, the example look-ahead selector 210 then decrements the look-ahead offset to select a substring/prefix beginning at the decremented look-ahead offset from the current input buffer position. In some such examples, the look-ahead selector 210 continues decrementing the look-ahead offset until a search of the input data buffer 110 at the positions stored in a hash chain corresponding to the look-ahead offset (after adjustment by the look-ahead offset) yields a matching prior repeated data string, or until the look-ahead offset equals 0.

The example data redundancy searcher 105 of FIG. 2 further includes an example hash indexer 215 to generate a hash chain index from a substring/prefix of the input data stored in the input data buffer 110. In the illustrated example of FIG. 2, the hash indexer 215 generates a hash chain index corresponding to the current input buffer position undergoing compression by accessing a substring/prefix of data bytes (e.g., 3 bytes or some other number of bytes) beginning at the currently selected look-ahead offset (e.g., as selected by the example look-ahead selector 210) from the current input buffer position in the input data buffer 110. In some examples, the hash indexer 215 further hashes the accessed substring/prefix of data bytes to form a hash chain index to be used to select the hash chain to be searched. In such examples, the hash indexer 215 can implement any appropriate hash function capable of reducing the size of a hash chain index relative to the size of a corresponding input substring/prefix.

For example, FIG. 7 illustrates operation of the data redundancy searcher 105 of FIG. 2 during two example compression processing cycles 705 and 710. In the first example compression processing cycle 705, the look-ahead offset selected by the example look-ahead selector 210 corresponds to a value of 0 and, thus, there is no look-ahead offset. Thus, the hash indexer 215 accesses an example substring/prefix 715 beginning at the current input buffer position 720 and hashes this substring/prefix 715 to determine a first example hash chain index 725, which indexes a first example hash chain 730. In the second example compression processing cycle 710, the look-ahead offset selected by the example look-ahead selector 210 corresponds to a value of 1 (e.g., corresponding to 1 byte). Thus, the hash indexer 215 accesses an example substring/prefix 735 beginning at the look-ahead offset of 1 position from the current input buffer position 720, and hashes this substring/prefix 735 to determine a second example hash chain index 740, which indexes a second example hash chain 745.

Returning to FIG. 2, to evaluate whether a hash chain indexed by a particular hash chain index determined by the example hash indexer 215 is a bad chain, the illustrated example data redundancy searcher 105 includes an example hash chain evaluator 220. Numerous methods for determining whether a hash is "good" or "bad" are disclosed throughout this specification, and none is intended to be limiting. In the illustrated example of FIG. 2, the hash chain evaluator 220 determines whether the hash chain indexed by the particular hash chain index determined by the example hash indexer 215 is a bad chain by evaluating whether the indexed hash chain satisfies one or more quality conditions.

In some examples, the hash chain evaluator 220 determines that the quality condition is satisfied for a particular hash chain being evaluated when the input substring/prefix used to generate the hash chain index indexing the hash chain does not appear in a blacklist. In some such examples, the data redundancy searcher 105 includes an example blacklist storage 225 to store a list (e.g., the blacklist) of substrings/prefixes that are likely to correspond to long hash chains for the type of data undergoing compression. For example, if the type of data stored in the input data buffer 110 undergoing compression is expected to be English text data, the blacklist stored in the example blacklist storage 225 can be constructed to include substrings/prefixes that commonly occur in the English language, such as "_th", "the", "he_", "_an", "and" and "nd_", etc. (where "_" represents a space), as described above. As another example, if the type of data stored in the input data buffer 110 undergoing compression is expected to be data served by a website, the blacklist stored in the example blacklist storage 225 can be constructed to include substrings/prefixes that commonly occur in files served by that website (e.g., such as substrings/prefixes based on hypertext markup language (HTML) keywords, keywords used in multimedia file formats (e.g., MPEG, AC3, etc.) used to store multimedia data served by the website, etc.), etc. Because such substrings/prefixes commonly occur in the type of data to be stored in the input data buffer 110, such substrings/prefixes are likely to be associated with long hash chains and, thus, are classified as corresponding to bad hash chains.

In some examples, the blacklist stored in the blacklist storage 225 is constructed by processing sample training data to determine the substrings/prefixes that occur most frequently in the training data, which are then included in the blacklist. In some examples, the blacklist stored in the blacklist storage 225 is constructed from external reference sources (e.g., dictionaries) characterizing the frequency of occurrence of substrings/prefixes in the type of data expected to be stored in the input data buffer 110 for compression. In some examples, the blacklist storage 225 stores different blacklists corresponding to different types of data capable of being compressed by the example data compressor 100. In some such examples, the hash chain evaluator 220 selects the particular blacklist after determining (e.g., automatically, based on an input selection) the type of data stored in the input data buffer 110. The example blacklist storage 225 can be implemented by any type(s) and/or number of memories, storage devices, etc., such as the example mass storage device 828 and/or the example volatile memory 814 in the example processor platform 800 of FIG. 8, which is described in further detail below.

Additionally or alternatively, in some examples, the hash chain evaluator 220 determines that the quality condition is satisfied for a particular hash chain being evaluated when the number of input buffer positions stored in the hash chain satisfies a threshold. In some such examples, the hash chain evaluator 220 maintains respective counts of the buffer positions stored in the hash chains being maintained by the example data redundancy searcher 105. In such examples, the hash chain evaluator 220 determines that the quality condition is satisfied for a particular hash chain being evaluated when the count of the buffer positions stored in the hash chain does not exceed the threshold.

The example data redundancy searcher 105 of FIG. 2 also includes an example hash chain matcher 230 to search the positions stored in a particular hash chain indexed by the particular hash chain index determined by the example hash indexer 215 (and, in some examples, determined by the example hash chain evaluator 220 to be a good chain) to find a prior repeated data string that matches a data string beginning at the current input buffer position undergoing compression. If the particular hash chain to be searched corresponds to a non-zero look-ahead offset (e.g., as selected by the look-ahead selector 210), the example hash chain matcher 230 further adjusts the buffer positions stored in the particular hash chain to compensate for the non-zero look-ahead offset to search the input data buffer 110 for a matching repeated data string at the adjusted buffer positions. For example, the hash chain matcher 230 may subtract the look-ahead offset from the buffer positions stored in the indexed hash chain to determine the adjusted buffer positions at which the hash chain matcher 230 is to search the input data buffer 110 for a prior repeated data string that that matches a data string beginning at the current input buffer position.

For example, in the first example processing cycle 705 illustrated in FIG. 7, the hash chain matcher 230 searches the input data buffer 110 at the example positions P1, P2 and P3 stored in the respective example elements 750, 755 and 760 of the example hash chain 730 for a prior repeated data string matching a data string beginning at the current input buffer position 720 and starting with the substring/prefix "abc". As the example hash chain 730 corresponds to the hash chain indexed by the hash of the substring/prefix "abc", each of the positions P1, P2, and P3 stored in the respective example elements 750, 755 and 760 corresponds to an occurrence of the substring/prefix "abc" in the history of the input data buffer 110, as shown in the figure (assuming no hash collisions have occurred). In the first example processing cycle 705, after searching the input data buffer 110 at the example positions P1, P2, and P3 stored in the respective example elements 750, 755 and 760 of the example hash chain 730, the hash chain matcher 230 determines that longest matching repeated data string is "abcd" corresponding to the position P3 stored in the element 760 of the hash chain 730. In this example, the hash chain matcher 230 outputs the position P3 stored in the element 760 and the length of the matching repeated data string (e.g., a length of 4 bytes in this example) in response to finding a successful match. In some examples, the hash chain matcher 230 also updates the example hash chain 730 to add an element corresponding to the current input buffer position 720 because the substring/prefix "abc" is also located at that position in the input data buffer 110.

As another example, assume that the example hash chain evaluator 220 determines that the example hash chain 730 does not satisfy the evaluated quality condition(s) and, thus, is a bad hash chain. In this example, processing proceeds to the second example processing cycle 710 illustrated in FIG. 7, which corresponds to a look-ahead offset of 1 position. In the second example processing cycle 710, the hash chain matcher 230 searches the input data buffer 110 at the example positions P1 and P2 stored in the respective example elements 765 and 770 of the example hash chain 745 for a prior repeated data string matching a data string beginning at the current input buffer position 720 and starting with the substring/prefix "abc". However, because the example hash chain 745 corresponds to a look-ahead offset of 1 position, the example hash chain 745 corresponds to the hash chain indexed by the hash of the substring/prefix "bcd" in the illustrated example and, thus, each of the positions P1 and P2 stored in the respective example elements 765 and 770 corresponds to an occurrence of the substring/prefix "bcd" in the history of the input data buffer 110. As such, the example hash chain matcher 230 adjusts the positions P1 and P2 stored in the respective elements 765 and 770 of the hash chain 745 by the look-ahead offset, which is 1 position in this example, and searches the input buffer 110 at the respective adjusted positions P1' and P2', as shown in the figure. In the second example processing cycle 710, after searching the input data buffer 110 at the example adjusted positions P1' and P2' corresponding to the positions P1 and P2 stored in the respective example elements 765 and 770 of the example hash chain 745, the hash chain matcher 230 determines that longest matching repeated data string is "abcde" corresponding to the position P2'. In this example, the hash chain matcher 230 outputs the position P2' and the length of the matching repeated data string (e.g., a length of 5 bytes in this example) in response to finding a successful match. In some examples, the hash chain matcher 230 also updates the example hash chain 745 to add an element corresponding to the look-ahead offset from the current input buffer position 720 because the substring/prefix "bcd" is also located at that position in the input data buffer 110. In some examples, the hash chain matcher 230 further updates the example hash chain 730 to add an element corresponding to the current input buffer position 720 because the substring/prefix "abc" is also located at that position in the input data buffer 110.

Returning to FIG. 2, the data redundancy searcher 105 of the illustrated example includes an example hash chain storage 235 to store an example hash chain data structure including the hash chains to be accessed, searched and/or updated, as appropriate, by the example hash chain matcher 230. For example, with reference to FIG. 7, the example hash chain data structure stored in the example hash chain storage 235 can include an example hash table 775 storing the hash chain indices that index the different hash chains 730, 745, etc., as well as one or more linked lists implementing the different hash chains 730, 745, etc. The example hash chain storage 235 can be implemented by any type(s) and/or number of memories, storage devices, etc., such as the example mass storage device 828 and/or the example volatile memory 814 in the example processor platform 800 of FIG. 8, which is described in further detail below.

The example data redundancy searcher 105 of FIG. 2 also includes an example data element outputter 240 to output data elements resulting from the string matching operations performed by the example hash chain matcher 230. In some examples, the data element outputter 240 outputs a data element corresponding to a pointer having the form <length, relative position> when the hash chain matcher 230 finds a prior repeated data string that matches a data string beginning at the current input buffer position. In such examples, the "length" data element represents the length of the matching repeated data string, and the "relative position" data element represents the distance from the current input buffer position back to the start of the matching repeated data string in the input data buffer 110. However, when the hash chain matcher 230 is unable to find a prior repeated data string that matches a data string beginning at the current input buffer position, in some examples, the data element outputter 240 outputs one or more literals corresponding to the actual data beginning at the current input buffer position. As mentioned above, the example input string reader 205 then advances the current input buffer position by an appropriate amount (e.g., by the length of the matching prior repeated string or by the number of literals output if no matching string is found) to permit the next input data in the input data buffer 110 to be compressed.

Figure 3:
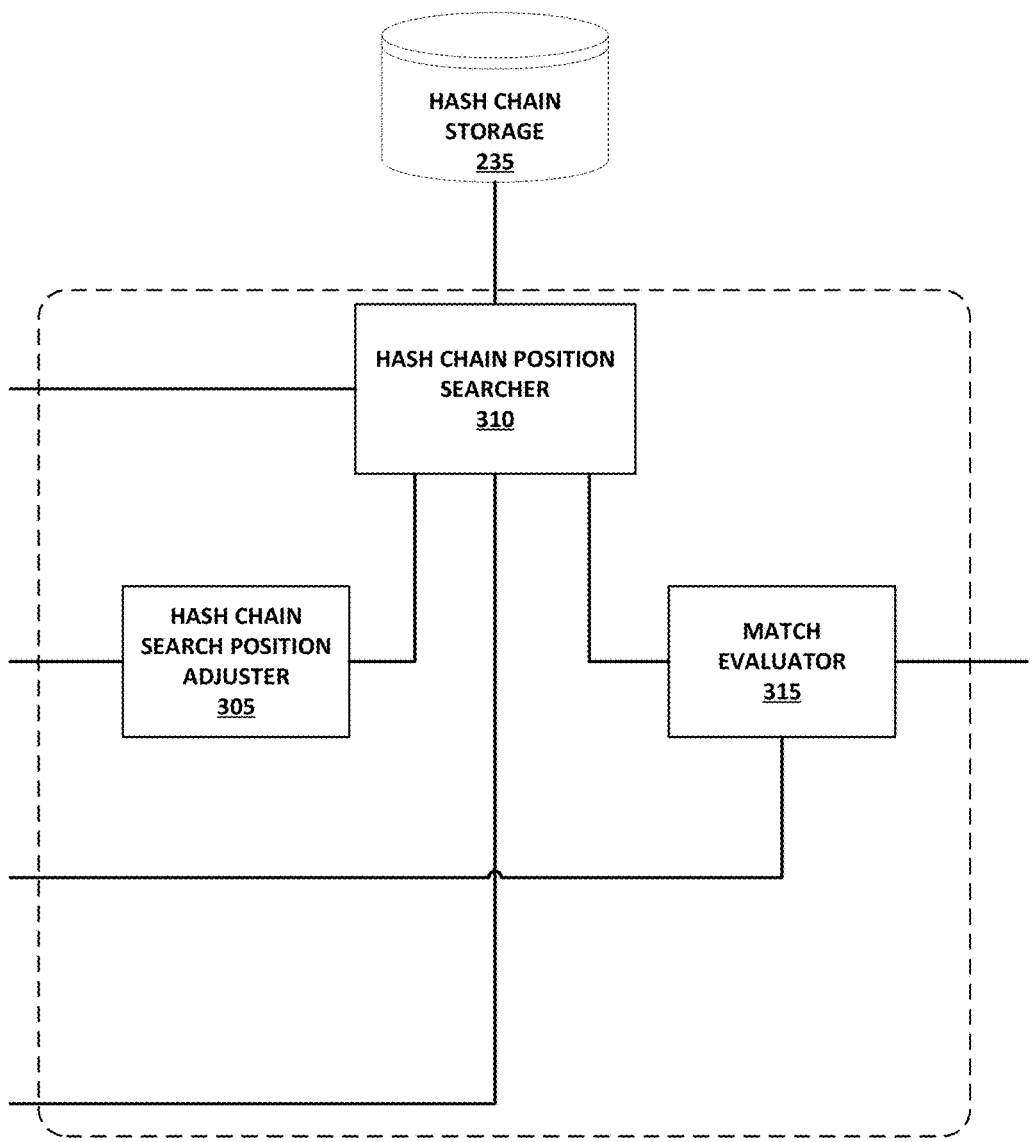
FIG. 3 is a block diagram of an example hash chain matcher that may be used to implement the data redundancy searchers according to embodiments of this specification.

A block diagram illustrating an example implementation of the hash chain matcher 230 of FIG. 2 is illustrated in FIG. 3. The example hash chain matcher 230 of FIG. 3 includes an example hash chain search position adjuster 305 to adjust the buffer positions stored in a particular hash chain being searched by the look-ahead offset used to access the input data substring/prefix for indexing the particular hash chain. For example, and as discussed above, the hash chain search position adjuster 305 may subtract the look-ahead offset, which was used to select the particular hash chain, from the buffer positions stored in the hash chain to determine adjusted buffer positions at which the input buffer 110 is to be searched for a prior repeated data string that matches a data string beginning at the current input buffer position.

The example hash chain matcher 230 of FIG. 3 also includes an example hash chain position searcher 310 to use a particular hash chain (e.g., indexed by the hash chain index determined by the example hash indexer 215) to search for a prior repeated data string in the input data buffer 110 that matches a data string beginning at the current input buffer position. For example, the hash chain position searcher 310 may walk the elements of the particular hash chain (e.g., as illustrated in the example of FIG. 7), and search the history of the input data buffer 110 at the positions stored in the elements of the particular hash chain, after adjustment by the example hash chain search position adjuster 305 if the hash chain corresponds to a non-zero look-ahead offset, to find a prior repeated data string in the input data buffer 110 that matches a data string beginning at the current input buffer position.

The example hash chain matcher 230 of FIG. 3 further includes an example match evaluator 315 to evaluate a data string match found by the example hash chain position searcher 310. In some examples, the example match evaluator 315 determines whether a matching prior repeated data string satisfies a length condition before indicating that the match was successful. For example, if the look-ahead offset used to find the matching prior repeated data string was zero (e.g., corresponding to no look-ahead offset), the match evaluator 315 may determine that the length condition is satisfied if the length of the matching prior repeated data string is at least equal to the size (e.g., 3 bytes or some other value) of the substrings/prefixes used to index the hash chains to be searched. As another example, if the look-ahead offset used to find the matching prior repeated data string was a non-zero value, the match evaluator 315 may determine that the length condition is satisfied if the length of the matching prior repeated data string is at least equal to the value of the look-ahead offset plus the size (e.g., 3 bytes or some other value) of the substrings/prefixes used to index the hash chains to be searched. Other length conditions can additionally or alternatively be used by the example match evaluator 315 to determine whether a matching prior repeated data string found by the example match evaluator 315 is acceptable or should be discarded.

While example manners of implementing the example data compressor 100 is illustrated in FIGS. 1-3, one or more of the elements, processes and/or devices illustrated in FIGS. 1-3 may be combined, divided, re-arranged, omitted, eliminated and/or implemented in any other way. Further, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310, the example match evaluator 315 and/or, more generally, the example data compressor 100 of FIGS. 1-3 may be implemented by hardware, software, firmware and/or any combination of hardware, software and/or firmware. Thus, for example, any of the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310, the example match evaluator 315 and/or, more generally, the example data compressor 100 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example data compressor 100, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310 and/or the example match evaluator 315 is/are hereby expressly defined to include a tangible computer readable storage device or storage disk such as a memory, a digital versatile disk (DVD), a compact disk (CD), a Blu-ray disk, etc. storing the software and/or firmware. Further still, the example data compressor 100 may include one or more elements, processes and/or devices in addition to, or instead of, those illustrated in FIGS. 1-3, and/or may include more than one of any or all of the illustrated elements, processes and devices.

Figure 4:
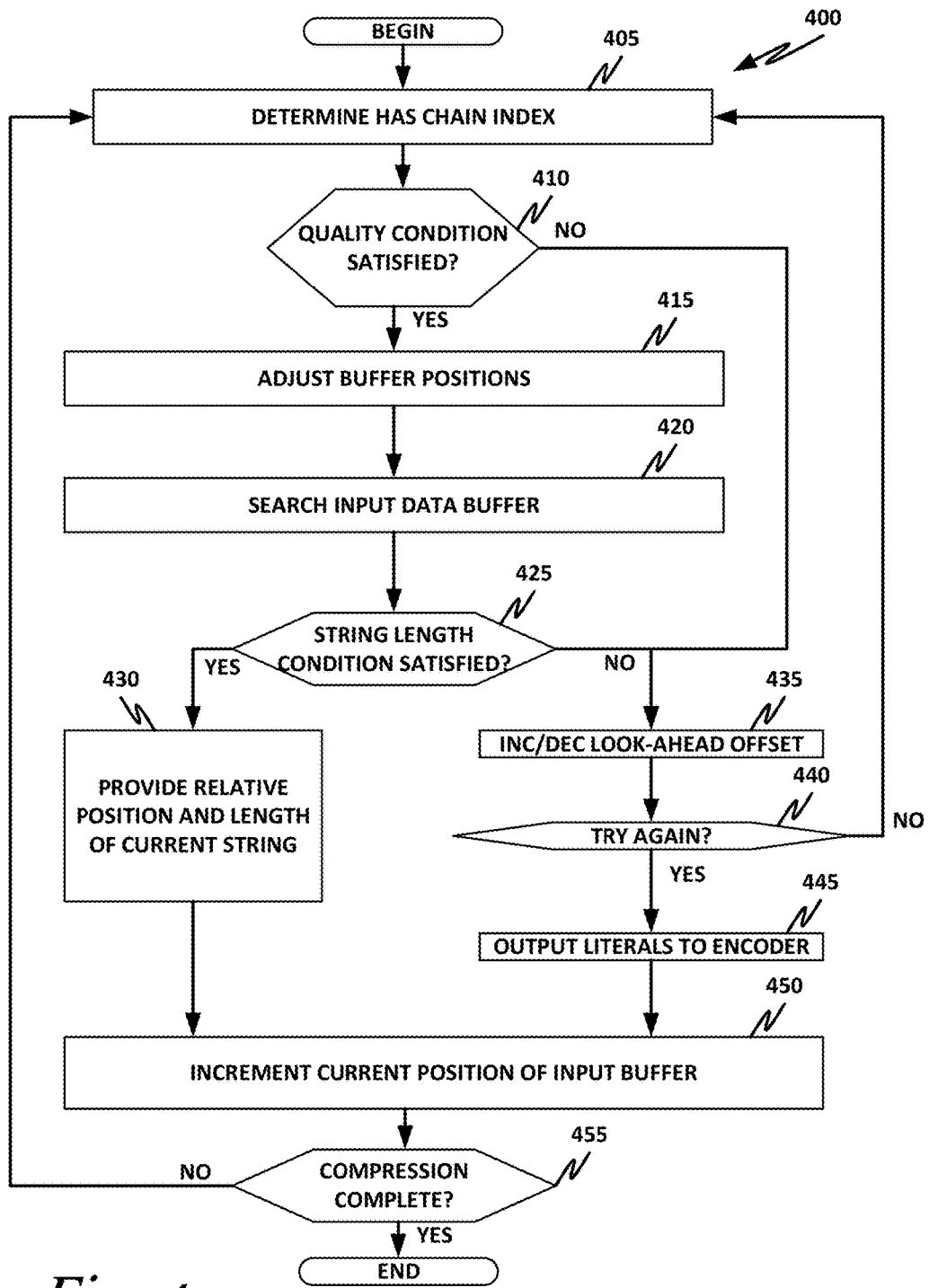
FIG. 4 is a flowchart representative of first example machine readable instructions that may be executed to implement data redundancy searchers according to embodiments of this specification.
Figure 5A:
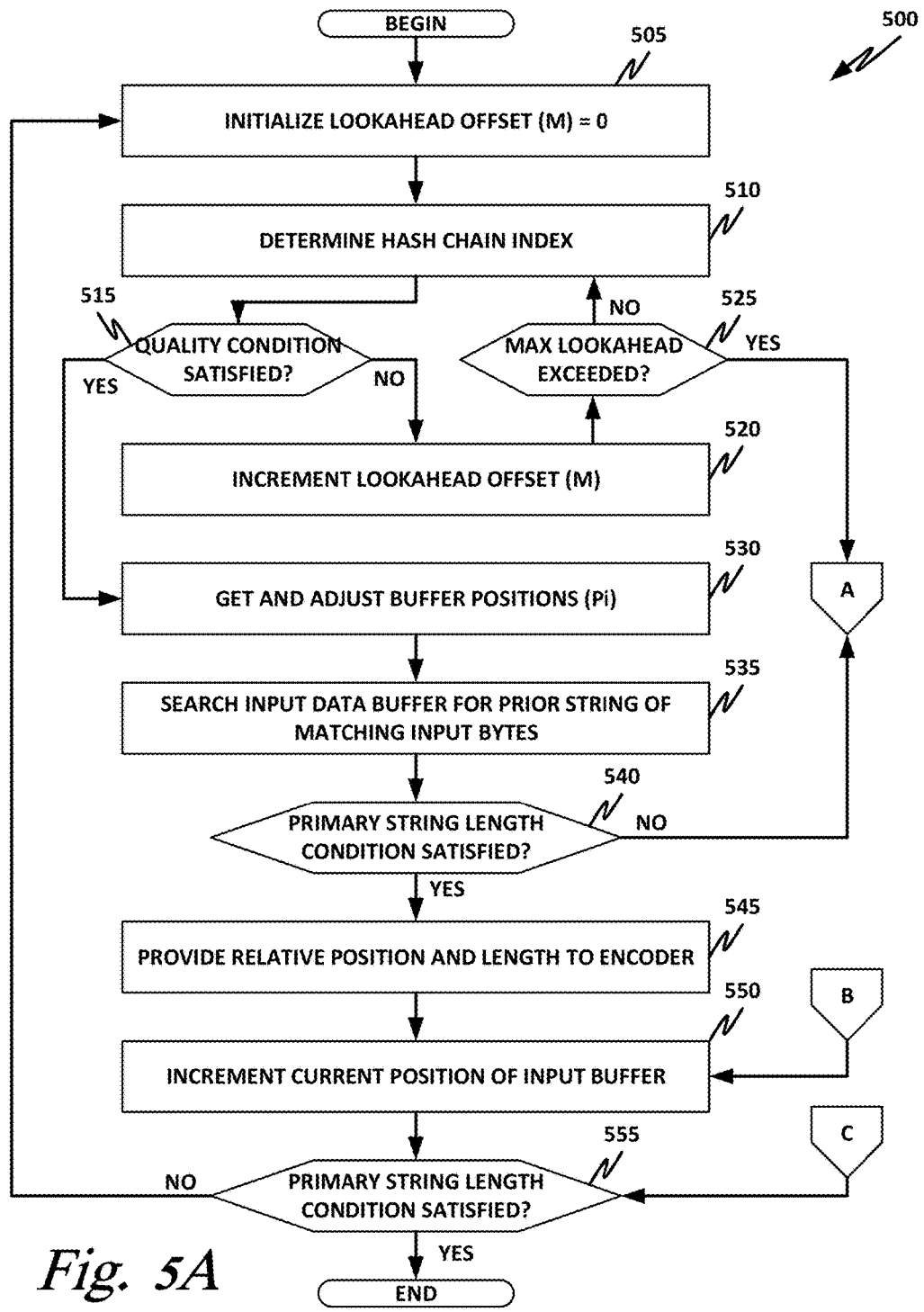
FIGS. 5a and 5b collectively form a flowchart of a method that may be executed to implement data redundancy searchers according to embodiments of this specification.
Figure 5B:
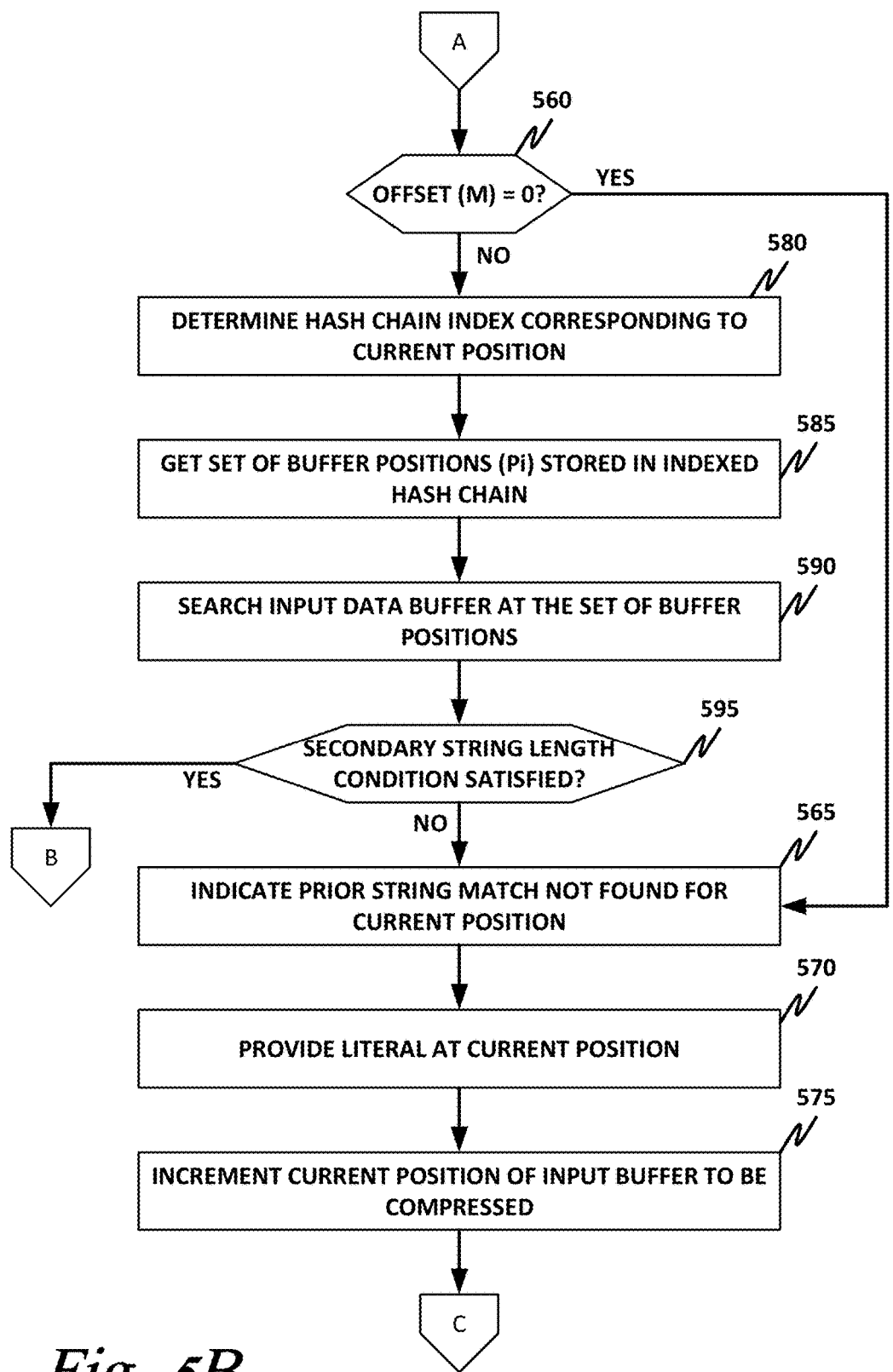

Flowcharts representative of example machine readable instructions for implementing the example data compressor 100, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310 and/or the example match evaluator 315 are shown in FIGS. 4 and 5A-5B. In these examples, the machine readable instructions comprise one or more programs for execution by a processor, such as the processor 812 shown in the example processor platform 800 discussed below in connection with FIG. 8. The one or more programs, or portion(s) thereof, may be embodied in software stored on a tangible computer readable storage medium such as a CD-ROM, a floppy disk, a hard drive, a digital versatile disk (DVD), a Blu-ray Disk™, or a memory associated with the processor 812, but the entire program or programs and/or portions thereof could alternatively be executed by a device other than the processor 812 and/or embodied in firmware or dedicated hardware (e.g., implemented by an ASIC, a PLD, an FPLD, discrete logic, etc.). Further, although the example program(s) is(are) described with reference to the flowcharts illustrated in FIGS. 4 and 5A-5B, many other methods of implementing the example data compressor 100, the example data redundancy searcher 105, the example input data buffer 110, the example data element encoder 115, the example compressed data buffer 120, the example input string reader 205, the example look-ahead selector 210, the example hash indexer 215, the example hash chain evaluator 220, the example blacklist storage 225, the example hash chain matcher 230, the example hash chain storage 235, the example data element outputter 240, the example hash chain search position adjuster 305, the example hash chain position searcher 310 and/or the example match evaluator 315 may alternatively be used. For example, with reference to the flowcharts illustrated in FIGS. 4 and 5A-B, the order of execution of the blocks may be changed, and/or some of the blocks described may be changed, eliminated, combined and/or subdivided into multiple blocks.

As mentioned above, the example processes of FIGS. 4 and 5A-5B may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 4 and 5A-5B may be implemented using coded instructions (e.g., computer and/or machine readable instructions) stored on a non-transitory computer and/or machine readable medium such as a hard disk drive, a flash memory, a ROM, a CD, a DVD, a cache, a RAM and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the terms "comprising" and "including" are open ended. Also, as used herein, the terms "computer readable" and "machine readable" are considered equivalent unless indicated otherwise.

A first example program 400 that may be executed to implement the example data redundancy searcher 105 of FIGS. 1 and/or 2 is represented by the flowchart illustrated in FIG. 4. For convenience and without loss of generality, execution of the example program 400 is described from the perspective of the example data redundancy searcher 105 of FIG. 2 being used to implement the example data compressor of FIG. 1. With reference to the preceding figures and associated written descriptions, the example program 400 of FIG. 4 begins execution at block 405 at which the example hash indexer 215 of the data redundancy searcher 105 determines, as described above, a hash chain index corresponding to the current input buffer position based on a group of input buffer bytes (e.g., a 3-byte substring/prefix) beginning at a selected look-ahead offset from the current input buffer position. For example, the look-ahead offset is determined, as described above, by the example look-ahead selector 210 of the data redundancy searcher 105.

At block 410, the example hash chain evaluator 220 of the data redundancy searcher 105 determines, as described above, whether a hash chain quality condition is satisfied by the hash chain indexed by the hash chain index determined at block 405. If the hash chain quality condition is satisfied (block 410) and, thus, the hash chain is considered to be a good hash chain, at block 415 the example hash chain matcher 230 of the data redundancy searcher 105 adjusts (e.g., using the example hash chain search position adjuster 305) the buffer positions stored in the indexed hash chain by the look-ahead offset to determine a set of adjusted buffer positions to be searched, as described above. At block 420, the example hash chain matcher 230 searches (e.g., using the example hash chain position searcher 310) the input data buffer 110 at the adjusted buffer positions to find a prior repeated data string (e.g., the longest prior repeated data string) matching a data string beginning at the current input buffer position, as described above. Assuming a matching prior repeated data string is found, at block 425 the hash chain matcher 230 determines (e.g., using the example match evaluator 315) whether a length condition for the matching prior repeated data string is satisfied. If the length condition is satisfied (block 425), at block 430 the example data element outputter 240 provides, as described above, the length and the relative position of the matching prior repeated data string to the example data element encoder 115 for encoding into the output compressed data buffer 120 corresponding to the input data buffer 110. Otherwise, processing proceeds to block 435.

Returning to block 410, if the hash chain quality condition is not satisfied for the hash chain indexed by the hash chain index determined at block 405 and, thus, the hash chain is considered to be a bad hash chain, processing also proceeds to block 435. At block 435, the data redundancy searcher 105 determines whether to attempt to perform string matching using another hash chain selected by, for example, incrementing or decrementing the look-ahead offset, as described above. For example, the look-ahead selector 210 of the data redundancy searcher 105 may increment the look-ahead offset (e.g., up to a threshold/maximum look-ahead offset) if the hash chain quality condition was not satisfied at block 410, or decrement (or reset) the look-ahead offset if the string length condition was not satisfied at block 425. At block 440, the data redundancy searcher 105 determines whether data string searching associated with the current input buffer position should continue. For example, at block 440, the data redundancy searcher 105 may determine that data string searching associated with the current input buffer position should continue if the threshold/maximum look-ahead offset has not been exceeded and a search corresponding to a look-ahead offset of 0 has not yet been performed, and that searching associated with the current input buffer position should be stopped otherwise. If searching should continue (block 440), then processing returns to block 405 and blocks subsequent thereto at which the data redundancy searcher 105 begins searching for a prior repeated string matching a data string beginning at the current input buffer position, but using a new hash chain index corresponding to the updated look-ahead offset determined at block 435.

However, if searching should not continue (block 440), processing proceeds to block 445. At block 445, the example data element outputter 240 then outputs one or more literals beginning at the current input buffer position (because no matching prior repeated data string has been found) to the example data element encoder 115 for encoding into the output compressed data buffer 120 corresponding to the input data buffer 110. At block 450, the example input string reader 205 of the data redundancy searcher 105 advances the current input buffer position by an appropriate amount (e.g., by the length of the matching prior repeated string or by the number of literals output if no matching string is found) to permit the next input data in the input data buffer 110 to be compressed. At block 450, the look-ahead selector 210 also resets the look-ahead offset to a starting value (e.g., 0 or some other value).

At block 455, the input string reader 205 determines whether compression of the input data buffer 110 is complete. If data compression is not complete (block 455), processing returns to block 405 and blocks subsequent thereto to permit the data redundancy searcher 105 to begin processing the next input data in the input data buffer 110. Otherwise, execution of the example program 400 ends.

A second example program 500 that may be executed to implement the example data redundancy searcher 105 of FIGS. 1 and/or 2 is represented by the flowchart illustrated collectively in FIGS. 5A-5B. Example pseudocode 600 corresponding to at least portions of the example program 500 is provided in FIG. 6. For convenience and without loss of generality, execution of the example program 500 and the example pseudocode 600 is described from the perspective of the example data redundancy searcher 105 of FIG. 2 being used to implement the example data compressor of FIG. 1. In this example, a prefix-string size of three (i.e., B=3) is used by way of concrete example to illustrate an embodiment. In a general case, any value of B may be used. With reference to the preceding figures and associated written descriptions, the example program 500 begins execution at block 505 of FIG. 5A at which the example look-ahead selector 210 of the data redundancy searcher 105 initializes the look-ahead offset (represented by "M" in the figure) to 0. The processing at block 505 corresponds to the processing at pseudocode lines 604-608 in FIG. 6.

At block 510, the example hash indexer 215 of the data redundancy searcher 105 determines, as described above, a hash chain index (represented by "IDX" in the figure) corresponding to the current input buffer position (represented by N in the figure) based on a group of input buffer bytes (e.g., N+2) beginning at the current input buffer position (because the look-ahead offset is currently set to 0). At block 515, the example hash chain evaluator 220 of the data redundancy searcher 105 determines, as described above, whether a hash chain quality condition is satisfied by the hash chain indexed by the hash chain index determined at block 510. If the hash chain quality condition is not satisfied (block 515) and, thus, the hash chain is considered to be a bad hash chain, at block 520 the look-ahead selector 210 increments the look-ahead offset (M). At block 525, the look-ahead selector 210 determines whether the incremented look-ahead offset exceeds a threshold. If the threshold is not exceeded (block 525), the processing at blocks 510-525 continues until the look-ahead offset yields a hash chain satisfying the quality condition, or the look-ahead threshold is exceeded. The processing at blocks 510-525 corresponds to the processing at pseudocode lines 612-628 in FIG. 6.

Assuming that, through the processing at blocks 510-525, a look-ahead offset yielding a good hash chain is found, at block 530 the example hash chain matcher 230 of the data redundancy searcher 105 gets and adjusts (e.g., using the example hash chain search position adjuster 305) the buffer positions (represented by Pi in the figure) stored in the indexed hash chain by the look-ahead offset (M) to determine a set of adjusted buffer positions (represented by Pi–M in the figure) to be searched, as described above. In the illustrated example, the data redundancy searcher 105 determines the adjusted buffer positions (Pi–M) at block 530 by subtracting the look-ahead offset (M) from the buffer positions (Pi) stored in the indexed hash chain. The processing at block 530 corresponds to the processing at pseudocode lines 632-636 in FIG. 6.

At block 535, the example hash chain matcher 230 searches (e.g., using the example hash chain position searcher 310) the input data buffer 110 at the adjusted buffer positions to find a prior repeated data string (e.g., the longest prior repeated data string) matching a data string beginning at the current input buffer position, as described above. The processing at block 535 corresponds to the processing at pseudocode line 640 in FIG. 6.

Assuming a matching prior repeated data string is found, at block 540 the hash chain matcher 230 determines (e.g., using the example match evaluator 315) whether a primary length condition for the matching prior repeated data string is satisfied. For example, at block 540, the hash chain matcher 230 determines whether the length (represented by L in the figure) of the matching prior repeated data string found at block 530 is greater than or equal to, for example, the three bytes forming the substring/prefix used for hash chain indexing, plus the look-ahead offset (M) (e.g., L≥M+3). If the primary length condition is satisfied (block 540), at block 545 the example data element outputter 240 provides, as described above, the length (L) and the relative position (N−Pi) of the matching prior repeated data string in the input buffer 110 to the example data element encoder 115 for encoding into the output compressed data buffer 120 corresponding to the input data buffer 110. The processing at blocks 540-545 corresponds to the processing at pseudocode line 644 in FIG. 6.

At block 550, the example input string reader 205 of the data redundancy searcher 105 advances the current input buffer position by an appropriate amount (e.g., by the length of the matching prior repeated string, corresponding to N=N+L) to permit the next input data in the input data buffer 110 to be compressed. At block 555, the input string reader 205 determines whether compression of the input data buffer 110 is complete. If data compression is not complete (block 555), processing returns to block 505 and blocks subsequent thereto to permit the data redundancy searcher 105 to begin processing the next input data in the input data buffer 110. Otherwise, execution of the example program 500 ends.

However, if the processing at block 510-525 does not result in a look-ahead offset yielding a good hash chain, or if at block 540 the matching prior repeated data string does not match the primary string length condition, processing proceed to block 560 of FIG. 5B. At block 560, the hash chain matcher 230 determines whether the look-ahead offset (M) is set to 0. If the look-ahead offset (M) is set to 0 (block 560), this means that the data redundancy searcher 105 determined that chain0 (corresponding to no look-ahead offset) was a good chain, but no prior repeated data string having a length of at three bytes (or some other appropriate value) was found. Accordingly, processing proceeds to block 565 at which the hash chain matcher 230 indicates that no prior repeated data string was found to match a string beginning at the current buffer location. The processing at block 565 corresponds to the processing at pseudocode line 652 in FIG. 6.

At block 570, the example data element outputter 240 outputs the literal (e.g., the 1-byte character) at the current position of the input data buffer 110 to the example data element encoder 115 for encoding into the output compressed data buffer 120 corresponding to the input data buffer 110. At block 575, the example input string reader 205 of the data redundancy searcher 105 advances the current input buffer position by an appropriate amount (e.g., by the number of literals output by the data element outputter 240, such as, N=N+1) to permit the next input data in the input data buffer 110 to be compressed. Processing then proceeds to block 555, which is described in detail above.

Returning to block 560, if the hash chain matcher 230 determines the look-ahead offset (M) is not set to 0 (block 560), this means the data redundancy searcher 105 has determined that either (i) some hash chain other than chain0 (corresponding to no look-ahead offset) was a good chain, but no prior repeated data string meeting the primary string length condition for that chain (e.g., a length of at least M+3 bytes) was found, or (ii) the threshold look-ahead offset was exceeded. In the illustrated example, processing proceeds to block 580 at which the hash indexer 215 defaults to determining a hash chain index (Idx) corresponding to the current input buffer position (N) based on a group of input buffer bytes (e.g., 3 bytes) beginning at the current input buffer position with no look-ahead offset. The processing at block 580 corresponds to the processing at pseudocode line 660 in FIG. 6.

At block 585, the example hash chain matcher 230 gets the buffer positions (Pi) stored in the indexed hash chain and, in some examples, prunes the set of buffer positions (Pi) to form a truncated set (e.g., of the first X buffer positions stored in the indexed hash chain, where X=8 or some other value). The processing at block 585 corresponds to the processing at pseudocode lines 664-668 in FIG. 6.

At block 590, the example hash chain matcher 230 searches the input data buffer 110 at the truncated set of buffer positions to find a prior repeated data string matching a data string beginning at the current input buffer position, as described above. In the illustrated example, the hash chain matcher 230 can stop searching at block 590 as soon as a matching prior repeated data string is found to have a length equal to the size of the group of bytes (3 in this example) forming the substring/prefix used for hash chain indexing plus one less than the final value of the look-ahead offset (M) (e.g., L=3+M−1=2+M). This is because that data redundancy searcher 105 has already determined that no matching prior repeated data string corresponding to the final value of the look-ahead offset (M) was found. The processing at block 590 corresponds to the processing at pseudocode line 672 in FIG. 6.

Assuming a matching prior repeated data string is found, at block 595 the hash chain matcher 230 determines whether a secondary string length condition for the matching prior repeated data string is satisfied. For example, at block 595, the hash chain matcher 230 determines whether the length (L) of the matching prior repeated data string found at block 590 is between the size of the group of bytes (3) forming the substring/prefix used for hash chain indexing, and this size plus one less than the final value of the look-ahead offset (M) (e.g., M+2) or, in other words, if 3≤L≤M+2). If the secondary string length condition is satisfied (block 595), processing proceeds to block 545, which is described in detail above. However, if the secondary string length condition is not satisfied (block 595), processing proceeds to block 565, which is described in detail above. This processing at block 595, 545 and 565 corresponds to the processing at pseudocode lines 676-680 in FIG. 6.

Figure 8:
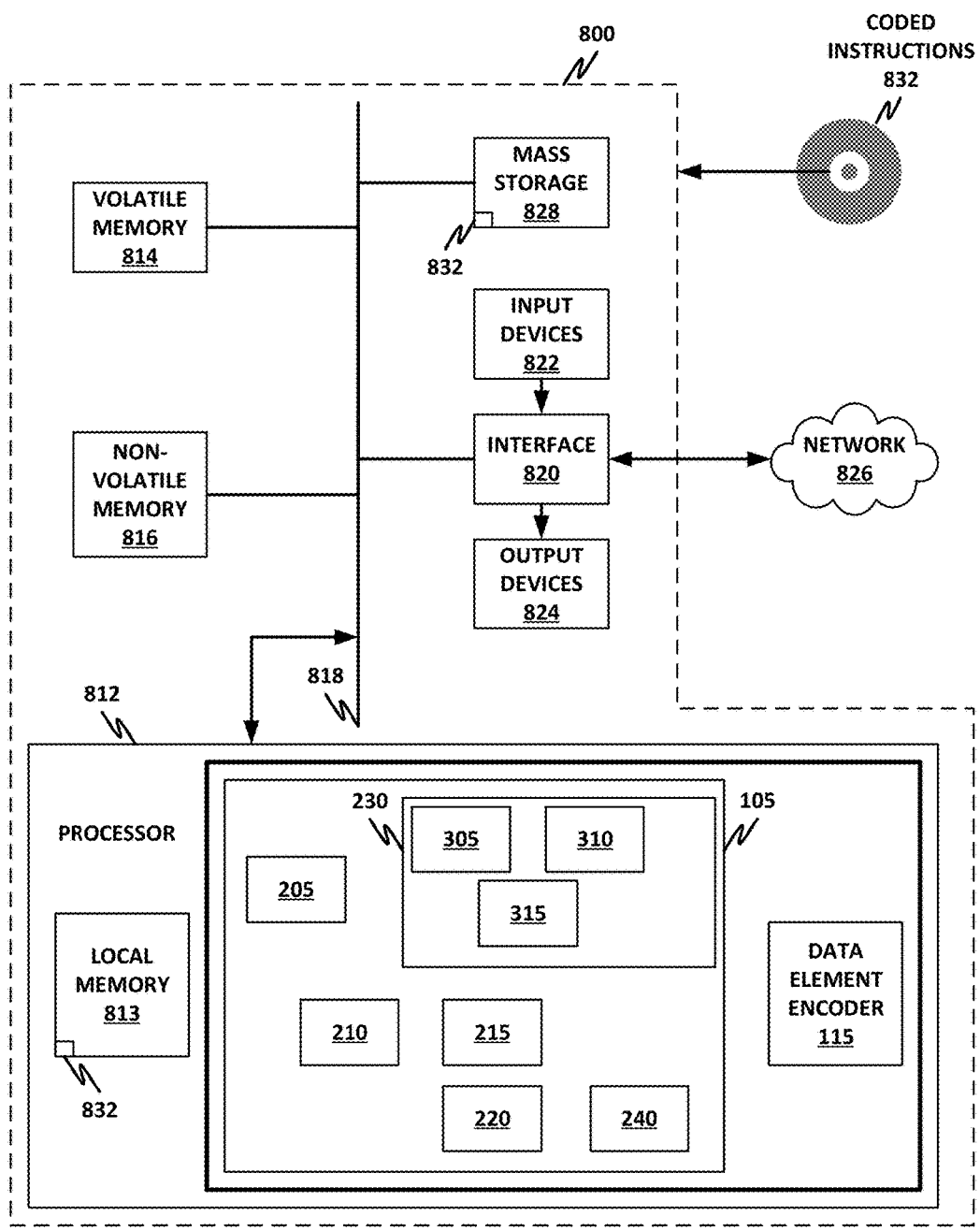
FIG. 8 is a block diagram of an example processor platform according to examples of this specification.

FIG. 8 is a block diagram of an example processor platform 800 capable of executing the instructions of FIGS. 4, 5A-5B and/or 6 to implement the example data compressor 100 of FIGS. 1-3. The processor platform 800 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box a digital camera, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer. In the illustrated example of FIG. 8, the processor 812 includes one or more example processing cores 815 configured via example instructions 832, which include the example instructions of FIGS. 4, 5A-5B and/or 6, to implement the example data redundancy searcher 105, the example data element encoder 115, the example input string reader 205, the example look-ahead selector 210, the example hash indexer 215, the example hash chain evaluator 220, the example hash chain matcher 230, the example data element outputter 240, the example hash chain search position adjuster 305, the example hash chain position searcher 310 and/or the example match evaluator 315 of FIGS. 1-3.

The processor 812 of the illustrated example includes a local memory 813 (e.g., a cache). The processor 812 of the illustrated example is in communication with a main memory including a volatile memory 814 and a non-volatile memory 816 via a link 818. The link 818 may be implemented by a bus, one or more point-to-point connections, etc., or a combination thereof. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 800, can allow the user to control the computer system and provide data to the computer using physical gestures, such as, but not limited to, hand or body movements, facial expressions, and face recognition. In some examples, one or more input devices 822 is/are structured to provide the example input data buffer 110 to be compressed by the example data compressor 100.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 820 of the illustrated example, thus, typically includes a graphics driver card, a graphics driver chip or a graphics driver processor. In some examples, one or more output devices 824 is/are structured to accept the example compressed data buffer 120 output by the example data compressor 100.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID (redundant array of independent disks) systems, and digital versatile disk (DVD) drives. In some examples, the mass storage device 828 may implement one or more of the example input data buffer 110, the example compressed data buffer 120, the example blacklist storage 225 and/or the example hash chain storage 235. Additionally or alternatively, in some examples the volatile memory 814 may implement one or more of the example input data buffer 110, the example compressed data buffer 120, the example blacklist storage 225 and/or the example hash chain storage 235.

Coded instructions 832 corresponding to the instructions of FIGS. 4, 5A-B and/or 6 may be stored in the mass storage device 828, in the volatile memory 814, in the non-volatile memory 816, in the local memory 813 and/or on a removable tangible computer readable storage medium, such as a CD or DVD 836.

Figure 9:
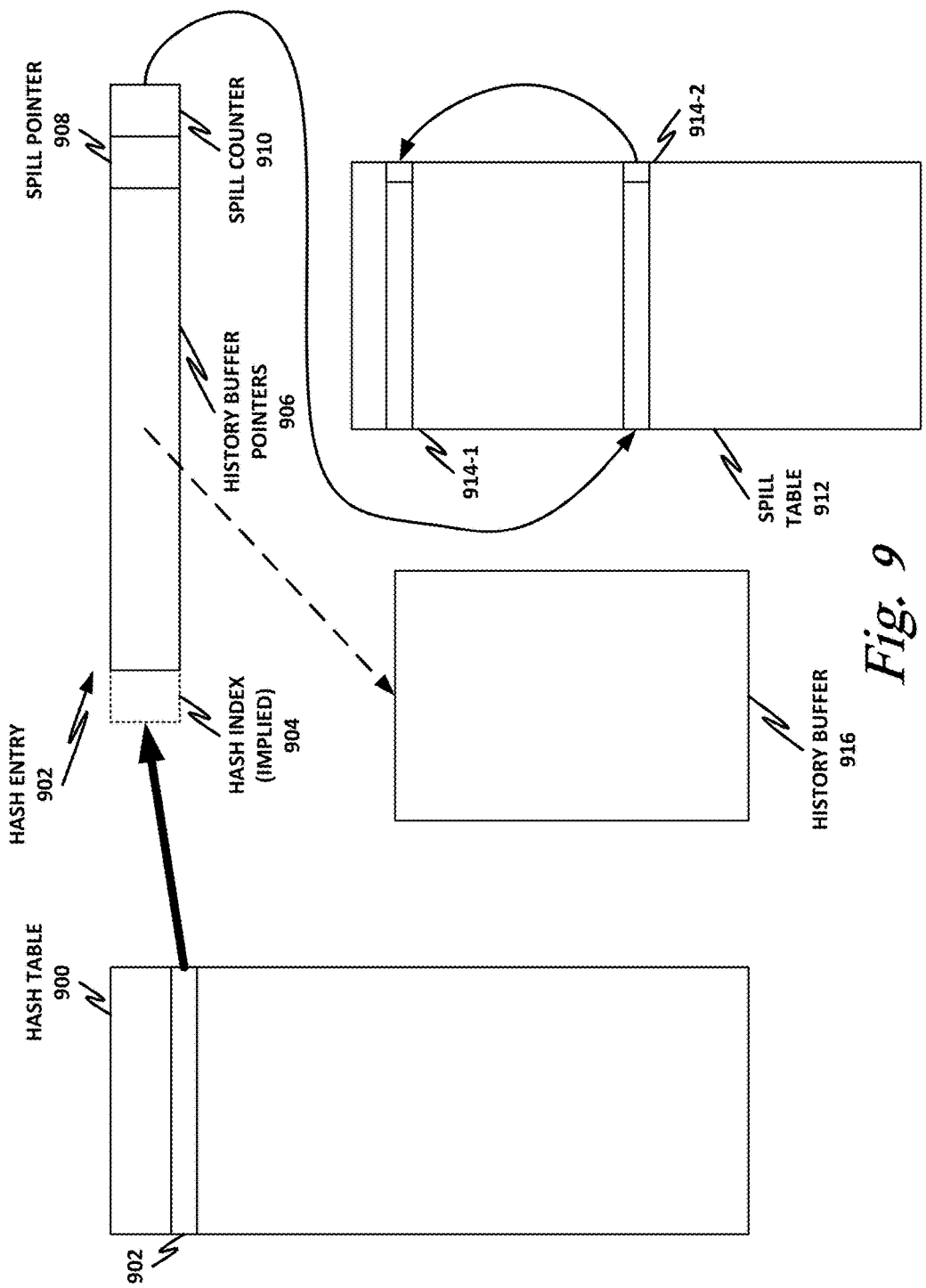
FIG. 9 is a block diagram of selected data structures according to examples of this specification.

FIG. 9 is a block diagram of a hash table and spill table according to embodiments of this specification. In this example, a hash table 900 is shown, and for an n-bit hash, includes a fixed $2^n$ entries. Each entry 902 in hash table 900 is indexed (904) by the hash itself. In other words, for an 8-bit hash, the table is an array of 256 records, with indices 000-255. Each 24-bit (3-byte) string hashes to exactly one of those values, and thus provides an index into the array. Each entry in the table includes a list of pointers (e.g., 12 pointers) into history buffer 916, which contains a copy of, for example, the most recent 32 kb from the original input file.

Note that if the hash size is not the same as the string size, each hash value correlates to more than one string, as the n-bit hash is not as wide as the string. For example, if an 8-bit hash is used, the hash table will have exactly 256 entries, representing the 256 unique hashes in the 8-bit space. The entry for each 8-bit hash includes a list of pointers to strings in history buffer 916 that hashed to that value. But these values may not have all come from the same string. For example, three different 24-bit strings may map to the same 8-bit hash. Thus, some of the pointers in a hash entry may not even provide a 3-byte match to the current string.

To increase compression level, long chains of historical matches may be maintained, so that a search can be made for the longest matching string (a longer chain implies more opportunities to find a longer match). However, it may not be practical to maintain a hash table with potentially thousands of pointers for each hash, particularly if the table is implemented in hardware or microcode, where memory space is limited. This may also be wasteful in that some hash entries may be very short because they are rarely or never matched (e.g., "bdx" is a 3-byte string that will not be expected to appear often, so the corresponding hash table entry may be very short or even empty, unless there is another more common string with the same hash). Thus, it may be advantageous to provide a relatively small hash table 900, with for example twelve pointers in history buffer 906.

However, for higher compression levels, it may still be necessary to search longer hash chains for common strings (such as a hash corresponding to "the"). Thus, in certain embodiments, it may be desirable to also provide a spill table 912. Spill table 912 is an overflow region of linked lists. Spill table 912 has a finite size, and may be configured as a "circular buffer," so that the oldest entries are displaced as the table becomes full. Unlike hash table 900, spill table 912 does not have a dedicated row for each hash value. Rather, each row is reached by a pointer from a previouslyfilled row. For example, hash entry 902 fills its history buffer pointers 906. When the compressor attempts to write a 13$^{th}$ entry into hash entry 902, the full hash entry (i.e., the group of history buffer pointers 906 and spill pointer 908) is copied into the next available row in spill table 912 (e.g., entry 914-2). Hash entry 902 is then cleared (except for spill counter 910, which is incremented). Spill pointer 908 now gets a pointer to the newly-populated spill table row 914-2, and the new pointer is added to hash entry 902. Hash entry 902 now contains only a single pointer to history buffer 916. As hash entry 902 again becomes full, the compressor may again copy the full data structure to the next available row in spill table 912 (e.g., row 914-1). Spill counter 910 is now incremented to "2." Row 914-1 now contains the pointer to row 914-2 that was added previously, thus creating a "last-in-first-out" (LIFO) chain.

Spill counter 910 can be used in chain-select embodiments as a proxy for the "goodness" of a particular chain. For example, with a hash table of 12 entries per row, if the string "them," appears in a document, the chain list for "the" may be very long—assume in this example that it is so long that it has saturated to 512 spills. The chain for "hem" may be much shorter. Assume, for example, that "hem" has a 32-spill count. The chain for "em," may be shorter yet, assume for example a 31-spill count. (See the "quality condition" of block 515 of FIG. 5.)

Thus, it may be advantageous, rather than searching the huge "the" chain of 512*12=6,144 entries (chain0), to search the much shorter "hem" or "em," chains (chain1 and chain2, respectively), looking for four- and five-byte matches respectively. In some embodiments, selection between "hem" and "em," may depend on how much shorter the chain is. For example, in one embodiment, a chain is selected as an "alternate" only if it is at least two shorter than the chain preceding it. In this case, "hem" at 32 spills is much shorter than "the" at 512 spills. But "em," at 31 spills is only one better than "hem" at 32 spills. Thus, "hem" is selected in favor of "the", but "em," is not selected in favor of "hem". The "hem" chain is then searched with a −1 offset for matches of at least four characters (corresponding to "them"). If no four-character or better match is found, then the search reverts to "the", but in this case, only three-character matches are considered, as the exhaustion of the "them" string implies that no four-character matches are available.

On the other hand, if "em," had been selected, either because it was two better than "hem", or because this embodiment required only a one-better spill count, then the "em," chain would be searched with a −2 index for five-character or better matches of "them,". If no 5-byte matches are found for "them,", the index may be rolled back to −1, and a search for a four-byte match of "them" may be made next. Finally, if no four-byte matches are found for "them" (i.e., this is the first time that "them" has appeared in the document), the compressor searches for three-bytes matches to "the".

In another embodiment, the selection above is biased only toward chain0. Thus, chain1 is used only if it is at least two shorter than chain0, and chain2 is used only if chain1 was not selected, and chain2 is at least two shorter than chain0.

In an embodiment, the spill counts for the next one (or two) three-character indices may be retrieved on the same cycle as, or the cycle directly following, retrieval of the first three-character index. No searching or matching is performed until the three spill counts are retrieved, and it is determined whether one is substantially better than the others. The search may be "left biased," meaning that "the" is preferred over "them", and "them" is preferred over "them,", all else being equal. Alternatively, "the" is preferred over both "them" and "them," while "them" and "them," are treated as essentially equal (i.e., the better of the two is used). As discussed above, an even stronger bias may be introduced, so that "them" is selected in favor of "the" only if its spill count is at least two better, and "them," is selected in favor of "them" only if its spill count is two better. Alternatively, there is a strong bias in favor of chain0 ("the"), so that one of the alternate chains is chosen only if it is two better, but as between the two alternate chains chain1 and chain2 ("them" and "them,"), chain2 ("them,") is chosen only if it is at least one better than chain1. Many other embodiments of potential selection criteria are possible.

In the above example, while walking chain2, the compressor expects to find matches that are 5 bytes or longer. It is possible, though less likely, that it will stumble upon a 4-byte match. For example, consider the scenario that the compressor chooses chain2 because it is one better than chain1. It finds no 5-byte matches for chain2, but happens to find a 4-byte match for chain1. In that case, in certain embodiments, the 4-byte chain1 match may be "cached" away in a memory location as a fallback position, in case no 5-byte matches for chain2 are found.

The name "spill counter" is used here to illustrate an embodiment, but in a more general sense, a "spill counter" may include any counter used to track the size of a history chain. The exact nature of spill counter 910 may be influenced or determined by design constraints. If history buffer pointers 906 are 64-bit pointers, for example, it may be relatively inexpensive to include a larger 16- or 24-bit counter that is large enough to keep an exact count of pointers to history buffer 906. On the other hand, if history buffer pointers 906 are smaller 8- or 16-bit pointers, adding a larger, exact spill counter may be excessive. In that case, a lower-resolution spill counter 910 may be used, such as a counter that counts only the number of rows occupied in a spill table, or that is incremented for only every i-th new entry (e.g., the spill counter may have only a four- or eight-count resolution). In yet another embodiment, spill counter 910 may be only a one, two, or three-bit counter, with only a few grades of size (e.g., "small" vs. "large," or "tiny," "small," "large," and "very large"). The selection of an appropriate spill counter 910 is an engineering task that depends on design constraints. For example, in hardware-accelerated compression schemes, wherein the compression algorithm is provided at least partly in microcode, smaller tables may be desirable to conform to the more limited on-chip resources.

Note also that the spill counts may be updated as spills occur, as in the discussion above, or in other suitable fashions. In one embodiment, the spill count is updated when a hash chain is actually searched. For example, when "the" is encountered, the compressor may search back 1,000 pointers to find a best match. The compressor thus knows that the chain for "the" is at least 1,000 entries long, and may encode the number 1,000 into spill counter 910 in any appropriate manner. Again, note that this may not be a single-count resolution where binary b001111101000 is encoded into spill counter 910. Rather, with an 8-count resolution, b01111101 (125) could instead be encoded, in which case the counter is not updated to b01111110 (126) until the count reaches 1,008.

Embodiments of the compressor may need to also deal with real-world practical limitations, such as a finite (possibly very small) spill counter field, or data types or regions within a file where chain-select may not be helpful. It may also need to adapt chain-select to existing data structures or implementations (e.g., as found in software implementations of zlib), or traditional hardware designs.

Regarding counter overflow, since the compressor does not decrement the spill counters during the update/lookup operations, at some point the 9-bit spill counter will overflow. Options for handling this include, for example, saturating the counters, or zeroing all spill counters the first or second time that one saturates. Each approach has different advantages. For example:

a. Saturating counters may work well smaller files. Saturated counters are simply treated as "large" chains. But for larger files, many counters may start to saturate (eventually, even the "good chains" will saturate), and eventually effectively disable chain-select, as no chain will appear to be better than any other chain. To implement a saturation scheme, one approach is to have the driver reset the counts in the state when the engine stops at a Huffman block boundary (since for a two-pass dynamic Huffman flow that's being done in software, the LZ engine is paused for some time with a traditional work submission model). This does not need to be done after each block, but may be done after some number of blocks.

b. Zeroing may be better for some larger files. Here, the compressor checks for the first overflow of a spill counter. Upon detecting either the first or second (or $N^{th}$) overflow of a spill counter, the compressor goes through and resets all of the counters to zero. The compressor then resumes the compression operation, starting counting from scratch. This technique may also help to identify data sets or regions where chain-select may not help.

In certain data regions or data structures, chain-select may not be helpful, or may in fact introduce additional overhead with insufficient offsetting gains. For example, it is theoretically possible that the compressor could search the "good chains", find no matches, and then search the default chain as well and find no matches. Thus, while chain-select works well in most cases, it is advantageous to identify those files, data structures, or regions where chain-select is not working well, and automatically turn it off.

An example heuristic is to maintain two separate counters. The first (sum1) counts the number of times the compressor searches an alternate chain (e.g., chain1 or chain2). The other (sum2) counts the number of times the compressor found no matches from traversing an alternate chain and had to revert back to the default chain0. The compressor may then check the ratio $$\frac{sum2}{sum1}$$

determine if it is larger than some threshold. For example, if the ratio is greater than 90%, then chain-select may be turned off for the rest of the file.

Non-limiting factors that may be considered in crafting a heuristic policy include:

a. Whether to perform averaging over the total file, or just over a (relatively long) window or block.

b. Once the compressor decides to disable chain-select, whether to leave it off or to turn it back on again after a specified number of bytes to "try again" (e.g., if the content has changed, chain-select may begin to work better).

Figure 10:
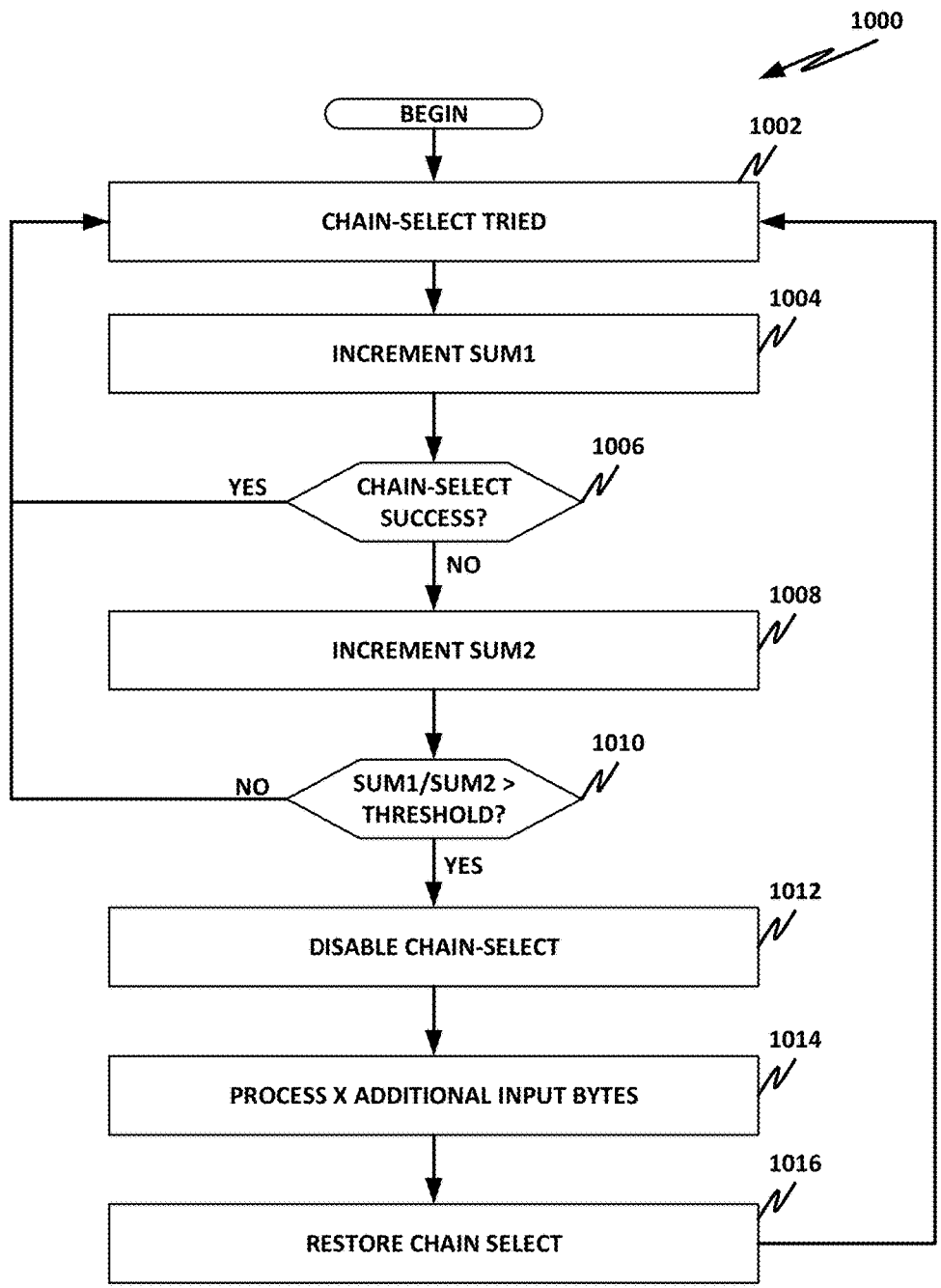
FIG. 10 is a flow diagram of an example heuristic for determining whether to enable, disable, or re-enable chain-select, according to embodiments of this specification

FIG. 10 is a flow diagram of an example heuristic method 1000 for determining whether to enable, disable, or re-enable chain-select, according to embodiments of this specification.

First, the compressor defines a counter "chain_select_disable." Whenever this counter is non-zero, the chain-select feature is disabled. To define chain_select_disable, define two counters, counting respectively invocations of chain-select (sum1), and failures of chain-select (sum2) (where a "failure" may include any instance where chain-select introduces greater overhead than any processor savings it provides, including cases where chain0 must be walked because chain1 failed).

The ratio of sums, chain_select_ratio, is defined as $$R = \frac{sum2}{sum1},$$

and is compared to a threshold once sum1 reaches a particular count. The following pseudocode may be used:

```
If (sum1 >= 4096)
{
    If ((chain_select_ratio != 0) &&
    (chain_select_disable == 0) &&
    (sum2/sum1 > chain_select_threshold)) then
    {
        chain_select_disable = chain_select_restore;
        sum1 = sum2 = 0;
    }
}
```

When the compressor advances by X bytes, it subtracts X from chain_select_disable, saturating at 0.

In one example, the following values may be useful:

```
chain_select_ratio = 3891 (i.e. 95% * 4096)
chain_select_restore = 8000
```

In one experimental example, chain-select was turned off at the beginning, and stayed off. As a further optimization, the above chain_select_restore was introduced. In that case, chain-select turned on again very shortly, and remained on for most of the remainder of the compression job. This provided approximately a 14% gain in performance, with a compression ratio better than "zlib-9." (Zlib provides a "compression level" option. Higher compression levels will try longer chains for longer matches, at the cost of speed.)

The method may be summarized as follows.

In block 1002, try a chain select operation, in which chain1 is found to have a shorter chain than chain0, so chain1 is traversed instead of chain0.

In block 1004, increment sum1 (counting the number of attempted chain selects).

In decision block 1006, determine whether the chain-select operation was a success. Chain-select is a success if a match for chain1 is found (or in cases where chain2 is tried, a match for chain2 is found). A failure occurs when the compressor must revert back to chain0 (or chain1, as the case may be).

If the chain-select operation was a success, no further action is needed.

In block 1008, if chain-select failed, then increment sum2.

In decision block 1010, determine whether the ratio $$R = \frac{sum1}{sum2}$$

is greater than a threshold (for example, if more than 95% of chain selects fail over a course of 4096 attempts).

If R is not greater than the threshold, then no further action is needed.

In block 1012, if R has exceeded the threshold, then it is determined that chain select is inefficient in this case, and chain select is disabled, at least temporarily.

In block 1014, process X additional input bytes. In one example, X=8,000, though any suitable value may be chosen.

In block 1016, restore chain select and return processing to block 902, where chain select is again attempted as before.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system may include any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the disclosure may also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part-on and part-off processor.

Thus, techniques for performing one or more instructions according to at least one embodiment are disclosed. While certain exemplary embodiments have been described and shown in the accompanying drawings, it is to be understood that such embodiments are merely illustrative of and not restrictive on other embodiments, and that such embodiments not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

In some embodiments of the present disclosure, a processor may include an execution unit, a front end, and an allocator. The front end may include circuitry to decode a first instruction to set a performance register for the execution unit and a second instruction. The performance register may include a mode field to specify a mode of operation for the execution unit. The allocator may include circuitry to assign the second instruction to the execution unit to execute the second instruction. In combination with any of the above embodiments, in an embodiment the execution unit may include circuitry to select between a normal computation, which may correspond to a normal result, and an accelerated computation, which may correspond to an accelerated result, based on the mode field of the performance register. The accelerated computation may be faster than the normal computation. In combination with any of the above embodiments, in an embodiment the execution unit may include circuitry to perform the selected computation. In combination with any of the above embodiments, in an embodiment the execution unit may include circuitry to select between the normal result and the accelerated result based on the mode field of the performance register.

In combination with any of the above embodiments, in an embodiment the second instruction may correspond to a multiplication operation and the normal computation may include circuitry to initialize a normal accumulation and a partial product counter. In combination with any of the above embodiments, in an embodiment the normal computation may include circuitry to determine a total number of partial products required based on input operands of the second instruction. In combination with any of the above embodiments, in an embodiment the normal computation may include circuitry to compute a partial product of the input operands. In combination with any of the above embodiments, in an embodiment the normal computation may include circuitry to increment the partial product counter, may add the normal accumulation to the computed partial product, and may store the result of the addition back in the normal accumulation. In combination with any of the above embodiments, in an embodiment the normal computation may include circuitry to determine whether to compute an additional partial product based on the partial product counter and the total number of partial products required. In combination with any of the above embodiments, in an embodiment the execution unit may include circuitry to store the normal accumulation in the normal result based on the determination that the additional partial product need not be computed.

In combination with any of the above embodiments, in an embodiment the second instruction may correspond to a multiplication operation and the accelerated computation may include circuitry to compute all partial products of input operands of the second instruction. In combination with any of the above embodiments, in an embodiment the accelerated computation may include circuitry to compute the accelerated result based on a sum of all the computed partial products. In combination with any of the above embodiments, in an embodiment the circuitry to determine the total number of partial products required, may be further based on an accuracy field of the performance register, and the normal computation may further include circuitry to order terms of the input operands for the circuitry to compute the partial product of the input operands. The order may prioritize a most significant term of each input operand. In combination with any of the above embodiments, in an embodiment the circuitry to determine the total number of partial products required, may be further based on a reduced size field of the performance register, and the normal computation may further include circuitry to order terms of the input operands for the circuitry to compute the partial product of the input operands. The order may prioritize a least significant term of each input operand. In combination with any of the above embodiments, in an embodiment the processor may include circuitry to monitor energy consumed, and circuitry to compare the energy consumed to a power threshold and may set the mode field of the performance register based on the comparison. In combination with any of the above embodiments, in an embodiment the accuracy field of the performance register may define a relative percentage of accuracy for the execution unit and circuitry to determine the total number of partial products required may be further based on a product of the total number of partial products required and the relative percentage of accuracy.

In some of the present embodiments, a method may include, setting a mode field of a performance register associated with an arithmetic logic unit. In combination with any of the above embodiments, in an embodiment the method may include decoding an instruction for the arithmetic logic unit. In combination with any of the above embodiments, in an embodiment the method may include selecting between a normal computation corresponding to a normal result and an accelerated computation corresponding to an accelerated result based on the mode field of the performance register. The accelerated computation may be faster than the normal computation. In combination with any of the above embodiments, in an embodiment the method may include performing the selected computation. In combination with any of the above embodiments, in an embodiment the method may include selecting between the normal result and the accelerated result based on the mode field of the performance register.

In combination with any of the above embodiments, in an embodiment the decoded instruction may correspond to a multiplication operation and the normal computation may include initializing a normal accumulation and a partial product counter. In combination with any of the above embodiments, in an embodiment the decoded instruction may correspond to a multiplication operation and the normal computation may include determining a total number of partial products required based on input operands of the decoded instruction. In combination with any of the above embodiments, in an embodiment the decoded instruction may correspond to a multiplication operation and the normal computation may include computing a partial product of the input operands. In combination with any of the above embodiments, in an embodiment the decoded instruction may correspond to a multiplication operation and the normal computation may include adding the normal accumulation to the computed partial product and storing the result of the addition back in the normal accumulation. In combination with any of the above embodiments, in an embodiment the decoded instruction may correspond to a multiplication operation and the normal computation may include incrementing the partial product counter. In combination with any of the above embodiments, in an embodiment the decoded instruction may correspond to a multiplication operation and the normal computation may include comparing the partial product counter to the total number of partial products required. In combination with any of the above embodiments, in an embodiment the decoded instruction may correspond to a multiplication operation and the normal computation may include determining whether to compute an additional partial product based on the comparison. In combination with any of the above embodiments, in an embodiment the decoded instruction may correspond to a multiplication operation and the normal computation may include storing the normal accumulation in the normal result based on the determination not to compute the additional partial product.

In combination with any of the above embodiments, in an embodiment the decoded instruction may correspond to a multiplication operation and the accelerated computation may include computing all partial products of input operands of the decoded instruction. In combination with any of the above embodiments, in an embodiment the decoded instruction may correspond to a multiplication operation and the accelerated computation may include computing a sum of all partial products. In combination with any of the above embodiments, in an embodiment the decoded instruction may correspond to a multiplication operation and the accelerated computation may include storing the sum in the accelerated result. In combination with any of the above embodiments, in an embodiment determining the total number of partial products required may be further based on an accuracy field of the performance register. In combination with any of the above embodiments, in an embodiment computing the partial product of the input operands may further include prioritizing a most significant term of each input operand for the partial product. In combination with any of the above embodiments, in an embodiment determining the total number of partial products required may be further based on a reduced size field of the performance register. In combination with any of the above embodiments, in an embodiment computing the partial product of the input operands may further include prioritizing a least significant term of each input operand for the partial product. In combination with any of the above embodiments, in an embodiment the method may include monitoring energy consumed by the arithmetic logic unit. In combination with any of the above embodiments, in an embodiment the method may include comparing the energy consumed to a power threshold. In combination with any of the above embodiments, in an embodiment the method may include setting the mode field of the performance register based on the comparison. In combination with any of the above embodiments, in an embodiment the accuracy field of the performance register may define a relative percentage of accuracy for the arithmetic logic unit. In combination with any of the above embodiments, in an embodiment determining the total number of partial products required may be further based on a product of the total number of partial products required and the relative percentage of accuracy.

In some embodiments of the present disclosure, a system may include an execution unit, a front end, and an allocator. The front end may decode a first instruction to set a performance register for the execution unit and a second instruction. The performance register may include circuitry to select between a normal computation, which may correspond to a normal result, and an accelerated computation, which may correspond to an accelerated result, based on the mode field of the performance register. The accelerated computation may be faster than the normal computation. In combination with any of the above embodiments, in an embodiment the execution unit may include circuitry to perform the selected computation. In combination with any of the above embodiments, in an embodiment the execution unit may include circuitry to select between the normal result and the accelerated result based on the mode field of the performance register.

In combination with any of the above embodiments, in an embodiment the second instruction may correspond to a multiplication operation and the normal computation may include circuitry to initialize a normal accumulation and a partial product counter. In combination with any of the above embodiments, in an embodiment the normal computation may include circuitry to determine a total number of partial products required based on input operands of the second instruction. In combination with any of the above embodiments, in an embodiment the normal computation may include circuitry to compute a partial product of the input operands. In combination with any of the above embodiments, in an embodiment the normal computation may include circuitry to increment the partial product counter, may add the normal accumulation to the computed partial product, and may store the result of the addition back in the normal accumulation. In combination with any of the above embodiments, in an embodiment the normal computation may include circuitry to determine whether to compute an additional partial product based on the partial product counter and the total number of partial products required. In combination with any of the above embodiments, in an embodiment the execution unit may include circuitry to store the normal accumulation in the normal result based on the determination that the additional partial product need not be computed.

In combination with any of the above embodiments, in an embodiment the second instruction may correspond to a multiplication operation and the accelerated computation may include circuitry to compute all partial products of input operands of the second instruction. In combination with any of the above embodiments, in an embodiment the accelerated computation may include circuitry to compute the accelerated result based on a sum of all the computed partial products. In combination with any of the above embodiments, in an embodiment circuitry to determine the total number of partial products required may be further based on an accuracy field of the performance register, and the normal computation may further include circuitry to order terms of the input operands for the circuitry to compute the partial product of the input operands. The order may prioritize a most significant term of each input operand. In combination with any of the above embodiments, in an embodiment circuitry to determine the total number of partial products required may be further based on a reduced size field of the performance register, and the normal computation may further include circuitry to order terms of the input operands for the circuitry to compute the partial product of the input operands. The order may prioritize a least significant term of each input operand. In combination with any of the above embodiments, in an embodiment the system may include circuitry to monitor energy consumed, compare the energy consumed to a power threshold, and set the mode field of the performance register based on the comparison. In combination with any of the above embodiments, in an embodiment the accuracy field of the performance register may define a relative percentage of accuracy for the execution unit and circuitry to determine the total number of partial products required may be further based on a product of the total number of partial products required and the relative percentage of accuracy.

In some embodiments of the present disclosure, an arithmetic logic unit may include a performance register including a mode field and four circuits. In combination with any of the above embodiments, in an embodiment the arithmetic logic unit may include circuitry to receive a decoded instruction. In combination with any of the above embodiments, in an embodiment the arithmetic logic unit may include circuitry to select between a normal computation corresponding to a normal result and an accelerated computation corresponding to an accelerated result based on the mode field of the performance register. The accelerated computation may be faster than the normal computation. In combination with any of the above embodiments, in an embodiment the arithmetic logic unit may include circuitry to perform the selected computation. In combination with any of the above embodiments, in an embodiment the arithmetic logic unit may include circuitry to select between the normal result and the accelerated result based on the mode field of the performance register.

In combination with any of the above embodiments, in an embodiment the decoded instruction may correspond to a multiplication operation and the normal computation may include circuitry to initialize a normal accumulation and a partial product counter. In combination with any of the above embodiments, in an embodiment the normal computation may include circuitry to determine a total number of partial products required based on input operands of the instruction. In combination with any of the above embodiments, in an embodiment the normal computation may include circuitry to compute a partial product of the input operands. In combination with any of the above embodiments, in an embodiment the normal computation may include circuitry to increment the partial product counter, may add the normal accumulation to the computed partial product, and may store the result of the addition back in the normal accumulation. In combination with any of the above embodiments, in an embodiment the normal computation may include circuitry to determine whether to compute an additional partial product based on the partial product counter and the total number of partial products required. In combination with any of the above embodiments, in an embodiment the normal computation may include circuitry to store the normal accumulation in the normal result based on the determination that the additional partial product need not be computed.

In combination with any of the above embodiments, in an embodiment the decoded instruction may correspond to a multiplication operation and the accelerated computation may include circuitry to compute all partial products of input operands of the instruction. In combination with any of the above embodiments, in an embodiment the accelerated computation may include circuitry to compute the accelerated result based on a sum of all the computed partial products. In combination with any of the above embodiments, in an embodiment the circuitry to determine the total number of partial products required, may be further based on an accuracy field of the performance register, and the circuitry to compute the partial product of the input operands, may further include circuitry to prioritize a most significant term of each input operand for the partial product. In combination with any of the above embodiments, in an embodiment the circuitry to determine the total number of partial products required, may be further based on a reduced size field of the performance register, and circuitry to compute the partial product of the input operands, may further include circuitry to prioritize a least significant term of each input operand for the partial product. In combination with any of the above embodiments, in an embodiment the accuracy field of the performance register may define a relative percentage of accuracy for the arithmetic logic unit, and the circuitry to determine the total number of partial products required, may be further based on a product of the total number of partial products required and the relative percentage of accuracy.

In some of the present embodiments, an apparatus may include a means for setting a mode field of a performance register associated with an arithmetic logic unit. In combination with any of the above embodiments, in an embodiment the apparatus may include a means for decoding an instruction for the arithmetic logic unit. In combination with any of the above embodiments, in an embodiment the apparatus may include a means for selecting between a normal computation means, which may correspond to a normal result, and an accelerated computation means, which may correspond to an accelerated result, based on the mode field of the performance register. The accelerated computation means may be faster than the normal computation means. In combination with any of the above embodiments, in an embodiment the apparatus may include a means for performing the selected computation means. In combination with any of the above embodiments, in an embodiment the apparatus may include a means for selecting between the normal result and the accelerated result based on the mode field of the performance register.

In combination with any of the above embodiments, in an embodiment the decoded instruction may correspond to a multiplication means and the normal computation means may include a means for initializing a normal accumulation and a partial product counter. In combination with any of the above embodiments, in an embodiment the normal computation means may include a means for determining a total number of partial products required based on input operands of the decoded instruction. In combination with any of the above embodiments, in an embodiment the normal computation means may include a means for computing a partial product of the input operands. In combination with any of the above embodiments, in an embodiment the normal computation means may include a means for adding the normal accumulation to the computed partial product and a means for storing the result of the addition back in the normal accumulation. In combination with any of the above embodiments, in an embodiment the normal computation means may include a means for incrementing the partial product counter. In combination with any of the above embodiments, in an embodiment the normal computation means may include a means for comparing the partial product counter to the total number of partial products required. In combination with any of the above embodiments, in an embodiment the normal computation means may include a means for determining whether to compute an additional partial product based on the means for comparison. In combination with any of the above embodiments, in an embodiment the normal computation means may include a means for storing the normal accumulation in the normal result based on the determination not to compute the additional partial product.

In combination with any of the above embodiments, in an embodiment the decoded instruction may correspond to a multiplication means and the accelerated computation means may include a means for computing all partial products of input operands of the decoded instruction. In combination with any of the above embodiments, in an embodiment the accelerated computation means may include a means for computing a sum of all partial products. In combination with any of the above embodiments, in an embodiment the accelerated computation means may include a means for storing the sum in the accelerated result. In combination with any of the above embodiments, in an embodiment the means for determining the total number of partial products required may be further based on an accuracy field of the performance register. In combination with any of the above embodiments, in an embodiment the means for computing the partial product of the input operands may further include a means for prioritizing a most significant term of each input operand for the partial product. In combination with any of the above embodiments, in an embodiment the means for determining the total number of partial products required may be further based on a reduced size field of the performance register. In combination with any of the above embodiments, in an embodiment the means for computing the partial product of the input operands may further include a means for prioritizing a least significant term of each input operand for the partial product. In combination with any of the above embodiments, in an embodiment the apparatus may include a means for monitoring energy consumed by the arithmetic logic unit. In combination with any of the above embodiments, in an embodiment the apparatus may include a means for comparing the energy consumed to a power threshold. In combination with any of the above embodiments, in an embodiment the apparatus may include a means for setting the mode field of the performance register based on the means for comparison. In combination with any of the above embodiments, in an embodiment the accuracy field of the performance register may define a relative percentage of accuracy for the arithmetic logic unit. In combination with any of the above embodiments, in an embodiment the means for determining the total number of partial products required may be further based on a product of the total number of partial products required and the relative percentage of accuracy.

EXAMPLE IMPLEMENTATIONS

In an example, there is disclosed an apparatus, comprising: a data store comprising a hash table having for at least some rows a hash entry indexed by a hash value, and comprising a hash chain of one or more pointers to a history buffer, and a spill counter; and one or more logic elements, including at least one hardware logic element, comprising a data compressor to: inspect a string0 comprising n bytes at position p in a data file; get the spill counter from a hash entry corresponding to string0; inspect a string1 comprising n bytes at p+k, wherein k is a positive integer; get the spill counter from a hash entry corresponding to string1; determine that the spill counter for string1 is less than the spill counter for string0; and search a chain1 (the hash chain of a hash entry corresponding to string1) for a matching string of size at least n+k with an offset of –k.

There is further disclosed an example, wherein the spill counter comprises a counter for a number of spill rows used in a spill table.

There is further disclosed an example, wherein the spill counter comprises a function of a length of chain1.

There is further disclosed an example, wherein the data compressor is to update the spill counter of a hash entry upon appropriating a new row of a spill table for the hash entry.

There is further disclosed an example, wherein the data compressor is to update the spill counter of a hash entry upon searching a hash chain for the hash entry.

There is further disclosed an example, wherein determining that the spill counter for chain1 is less than that spill counter for chain0 comprises determining that the spill counter for chain1 is at least two less than the spill counter for chain0.

There is further disclosed an example, wherein the data compressor is further to: inspect a string2 comprising n bytes at p+2k; get the spill counter for a hash entry corresponding to string2; determine that the spill counter for string2 is less than the spill counter for string1; and search a chain2 (the hash chain of a hash entry corresponding to string2) for a matching string of size at least n+2k with an offset of –2k.

There is further disclosed an example, wherein the data compressor is further to determine that no matching string of at least n+2k was found, and to fall back to a found match of a smaller size.

There is further disclosed an example, wherein the data compressor is further to determine that the search of chain1 yielded no matches of size at least n+k, and search a chain0 (the hash chain of a hash entry corresponding to string0) for a matching string of at least size n.

There is further disclosed an example, wherein the data compressor is further to determine that chain-select is not efficient, and to disable chain-select.

There is further disclosed an example, wherein determining that chain-select is not efficient comprises determining that a ratio of chain1 search failures to chain1 searches is higher than a threshold.

There is further disclosed an example, wherein the data compressor is further to re-enable chain-select after processing a number of input bytes.

There is further disclosed an example, wherein the data compressor is implemented at least partly in microcode.

There is further disclosed an example, wherein k=1.

There is further disclosed an example of a method of providing a data compressor, comprising: providing a hash table having for at least some rows a hash entry indexed by a hash value, and comprising a hash chain of one or more pointers to a history buffer, and a spill counter; and inspecting a string0 comprising n bytes at position p in a data file; getting the spill counter from a hash entry corresponding to string0; inspecting a string1 comprising n bytes at p+k, wherein k is a positive integer; getting the spill counter from a hash entry corresponding to string1; determining that the spill counter for string1 is less than the spill counter for string0; and searching a chain1 (the hash chain of a hash entry corresponding to string1) for a matching string of size at least n+k with an offset of –k.

There is further disclosed an example, wherein the spill counter comprises a counter for a number of spill rows used in a spill table.

There is further disclosed an example, wherein the spill counter comprises a function of a length of chain1.

There is further disclosed an example, further comprising updating the spill counter of a hash entry upon appropriating a new row of a spill table for the hash entry.

There is further disclosed an example, further comprising updating the spill counter of a hash entry upon searching a hash chain for the hash entry.

There is further disclosed an example, wherein determining that the spill counter for chain1 is less than that spill counter for chain0 comprises determining that the spill counter for chain1 is at least two less than the spill counter for chain0.

There is further disclosed an example, further comprising: inspecting a string2 comprising n bytes at p+2k; getting the spill counter for a hash entry corresponding to string2; determining that the spill counter for string2 is less than the spill counter for string1; and searching a chain2 (the hash chain of a hash entry corresponding to string2) for a matching string of size at least n+2k with an offset of –2k.

There is further disclosed an example, further comprising determining that no matching string of at least n+2k was found, and to fall back to a found match of a smaller size.

There is further disclosed an example, further comprising determining that the search of chain1 yielded no matches of size at least n+k, and searching a chain0 (the hash chain of a hash entry corresponding to string0) for a matching string of at least size n.

There is further disclosed an example, further comprising determining that chain-select is not efficient, and to disable chain-select.

There is further disclosed an example, wherein determining that chain-select is not efficient comprises determining that a ratio of chain1 search failures to chain1 searches is higher than a threshold.

There is further disclosed an example, further comprising re-enabling chain-select after processing a number of input bytes.

There is further disclosed an example, wherein k=1.

There is further disclosed an example of one or more tangible, non-transitory computer-readable mediums having stored thereon executable instructions for: providing a hash table having for at least some rows a hash entry indexed by a hash value, and comprising a hash chain of one or more pointers to a history buffer, and a spill counter; and inspecting a string0 comprising n bytes at position p in a data file; getting the spill counter from a hash entry corresponding to string0; inspecting a string1 comprising n bytes at p+k, wherein k is a positive integer; getting the spill counter from a hash entry corresponding to string1; determining that the spill counter for string1 is less than the spill counter for string0; and searching a chain1 (the hash chain of a hash entry corresponding to string1) for a matching string of size at least n+k with an offset of –k.

There is further disclosed an example, wherein the spill counter comprises a counter for a number of spill rows used in a spill table.

There is further disclosed an example, wherein the spill counter comprises a function of a length of chain1.

There is further disclosed an example, wherein the instructions are further for further comprising updating the spill counter of a hash entry upon appropriating a new row of a spill table for the hash entry.

There is further disclosed an example, wherein the instructions are further for comprising updating the spill counter of a hash entry upon searching a hash chain for the hash entry.

There is further disclosed an example, wherein determining that the spill counter for chain1 is less than that spill counter for chain0 comprises determining that the spill counter for chain1 is at least two less than the spill counter for chain0.

There is further disclosed an example, wherein the instructions are further for: inspecting a string2 comprising n bytes at p+2k; getting the spill counter for a hash entry corresponding to string2; determining that the spill counter for string2 is less than the spill counter for string1; and searching a chain2 (the hash chain of a hash entry corresponding to string2) for a matching string of size at least n+2k with an offset of −2k.

There is further disclosed an example, wherein the instructions are further for determining that no matching string of at least n+2k was found, and to fall back to a found match of a smaller size.

There is further disclosed an example, wherein the instructions are further for determining that the search of chain1 yielded no matches of size at least n+k, and searching a chain0 (the hash chain of a hash entry corresponding to string0) for a matching string of at least size n.

There is further disclosed an example, wherein the instructions are further for determining that chain-select is not efficient, and to disable chain-select.

There is further disclosed an example, wherein determining that chain-select is not efficient comprises determining that a ratio of chain1 search failures to chain1 searches is higher than a threshold.

There is further disclosed an example, wherein the instructions are further for re-enabling chain-select after processing a number of input bytes.

There is further disclosed an example, wherein k=1.

What is claimed is:

1. An apparatus, comprising:
    a data store comprising a hash table having, for at least some rows, a hash entry indexed by a hash value, wherein the hash entry comprises a hash chain of one or more pointers to a history buffer, and further comprises a spill counter; and
    hardware circuitry of a data compressor to:
        inspect a string0 comprising n bytes of data at position p bytes in a data file;
        get the spill counter from a first hash entry corresponding to string0;
        inspect a string1 comprising n bytes of data at p+k, wherein k is a positive integer number of bytes;
        get the spill counter from a second hash entry corresponding to string1;
        determine that the spill counter for string1 is less than the spill counter for string0; and
        search the particular hash chain of the second hash entry corresponding to string1 for a matching string of size at least n+k with an offset of −k.

2. The apparatus of claim 1, wherein the spill counter comprises a counter for a number of spill rows used in a spill table.

3. The apparatus of claim 1, wherein the spill counter comprises a function of a length of the particular hash chain.

4. The apparatus of claim 1, wherein the data compressor is to update the spill counter of a hash entry upon appropriating a new row of a spill table for the hash entry.

5. The apparatus of claim 1, wherein the data compressor is to update the spill counter of a hash entry upon searching a hash chain for the hash entry.

6. The apparatus of claim 1, wherein determining that the spill counter for the particular hash chain is less than that spill counter for a chain of the first hash entry comprises determining that the spill counter for the particular hash chain is at least two less than the spill counter for the chain of the first hash entry.

7. The apparatus of claim 1, wherein the data compressor is further to:
    inspect a string2 comprising n bytes at p+2k;
    get the spill counter for a hash entry corresponding to string2;
    determine that the spill counter for string2 is less than the spill counter for string1; and
    search the hash chain of a hash entry corresponding to string2 for a matching string of size at least n+2k with an offset of −2k.

8. The apparatus of claim 7, wherein the data compressor is further to determine that no matching string of at least n+2k was found, and to fall back to a found match of a smaller size.

9. The apparatus of claim 1, wherein the data compressor is further to determine that the search of the particular hash chain yielded no matches of size at least n+k, and search the hash chain of the first hash entry for a matching string of at least size n.

10. The apparatus of claim 8, wherein the data compressor is further to:
    determine that a ratio of search failures involving the particular hash chain is higher than a threshold value;
    determine that chain-select is not efficient based on determining that the ratio of search failures is higher than the threshold value; and
    disable chain-select based on determining that the chain-select is not efficient.

11. The apparatus of claim 9, wherein the ratio of search failures comprises a ratio of search failures involving the particular hash chain to searches involving the particular hash chain.

12. The apparatus of claim 10, wherein the data compressor is further to re-enable chain-select after processing a number of input bytes.

13. The apparatus of claim 1, wherein the data compressor is implemented at least partly in microcode.

14. The apparatus of claim 1, wherein k=1.

15. A method of providing a data compressor, comprising:
    providing a hash table having, for at least some rows, a hash entry indexed by a hash value, wherein the hash entry comprises a hash chain of one or more pointers to a history buffer, and further comprises a spill counter;
    inspecting a string0 comprising n bytes of data at position p bytes in a data file;
    getting the spill counter from a first hash entry corresponding to string0;
    inspecting a string1 comprising n bytes of data at p+k, wherein k is a positive integer number of bytes;
    getting the spill counter from a second hash entry corresponding to string1;
    determining that the spill counter for string1 is less than the spill counter for string0; and searching the particular hash chain of the second hash entry corresponding to string1 for a matching string of size at least n+k with an offset of −k.

16. The method of claim 15, wherein the spill counter comprises a counter for a number of spill rows used in a spill table.

17. The method of claim 15, wherein the spill counter comprises a function of a length of the particular hash chain.

18. The method of claim 15, further comprising updating the spill counter of a hash entry upon appropriating a new row of a spill table for the hash entry.

19. The method of claim 15, further comprising updating the spill counter of a hash entry upon searching a hash chain for the hash entry.

20. The method of claim 15, wherein determining that the spill counter for the particular hash chain is less than that spill counter for a chain of the first hash entry comprises determining that the spill counter for the particular hash chain is at least two less than the spill counter for the chain of the first hash entry.

21. The method of claim 15, further comprising:
inspecting a string2 comprising n bytes at p+2k;
getting the spill counter for a hash entry corresponding to string2;
determining that the spill counter for string2 is less than the spill counter for string1; and
searching a chain2 (the hash chain of a hash entry corresponding to string2) for a matching string of size at least n+2k with an offset of −2k.

22. The method of claim 21, further comprising determining that no matching string of at least n+2k was found, and to fall back to a found match of a smaller size.

23. The method of claim 15, further comprising determining that the search of the particular hash chain yielded no matches of size at least n+k, and search the hash chain of the first hash entry for a matching string of at least size n.

24. The method of claim 23, further comprising:
determining that a ratio of search failures involving the particular hash chain is higher than a threshold value;
determining that chain-select is not efficient based on determining that the ratio of search failures is higher than the threshold value; and
disabling chain-select based on determining that the chain-select is not efficient.

25. The method of claim 24, wherein the ratio of search failures comprises a ratio of search failures involving the particular hash chain to searches involving the particular hash chain.

26. The method of claim 25, further comprising re-enabling chain-select after processing a number of input bytes.

27. The method of claim 15, wherein k=1.

28. One or more tangible, non-transitory computer-readable mediums having stored thereon executable instructions for:
providing a hash table having, for at least some rows, a hash entry indexed by a hash value, wherein the hash entry comprises a hash chain of one or more pointers to a history buffer, and further comprises a spill counter;
inspecting a string0 comprising n bytes of data at position p bytes in a data file;
getting the spill counter from a first hash entry corresponding to string0;
inspecting a string1 comprising n bytes of data at p+k, wherein k is a positive integer number of bytes;
getting the spill counter from a second hash entry corresponding to string1;
determining that the spill counter for string1 is less than the spill counter for string0; and
searching the particular hash chain of the second hash entry corresponding to string1 for a matching string of size at least n+k with an offset of −k.

29. The one or more tangible, non-transitory computer-readable mediums of claim 28, wherein the spill counter comprises a counter for a number of spill rows used in a spill table.

30. The one or more tangible, non-transitory computer-readable mediums of claim 28, wherein the spill counter comprises a function of a length of the particular hash chain.

31. The one or more tangible, non-transitory computer-readable mediums of claim 28, wherein the instructions are further for further comprising updating the spill counter of a hash entry upon appropriating a new row of a spill table for the hash entry.

32. The one or more tangible, non-transitory computer-readable mediums of claim 28, wherein the instructions are further for comprising updating the spill counter of a hash entry upon searching a hash chain for the hash entry.

33. The one or more tangible, non-transitory computer-readable mediums of claim 28, wherein determining that the spill counter for the particular hash chain is less than that spill counter for a chain of the first hash entry comprises determining that the spill counter for the particular hash chain is at least two less than the spill counter for the chain of the first hash entry.

34. The one or more tangible, non-transitory computer-readable mediums of claim 28, wherein the instructions are further for:
inspecting a string2 comprising n bytes at p+2k;
getting the spill counter for a hash entry corresponding to string2;
determining that the spill counter for string2 is less than the spill counter for string1; and
searching a chain2 (the hash chain of a hash entry corresponding to string2) for a matching string of size at least n+2k with an offset of −2k.

35. The one or more tangible, non-transitory computer-readable mediums of claim 34, wherein the instructions are further for determining that no matching string of at least n+2k was found, and to fall back to a found match of a smaller size.

36. The one or more tangible, non-transitory computer-readable mediums of claim 28, wherein the instructions are further for determining that the search of the particular hash chain yielded no matches of size at least n+k, and search the hash chain of the first hash entry for a matching string of at least size n.

37. The one or more tangible, non-transitory computer-readable mediums of claim 36, wherein the instructions are further for:
determining that a ratio of search failures involving the particular hash chain is higher than a threshold value;
determining that chain-select is not efficient based on determining that the ratio of search failures is higher than the threshold value; and
disabling chain-select based on determining that the chain-select is not efficient.

38. The one or more tangible, non-transitory computer-readable mediums of claim 37, wherein determining that chain-select is not efficient comprises the ratio of search failures comprises a ratio of search failures involving the particular hash chain to searches involving the particular hash chain.

39. The one or more tangible, non-transitory computer-readable mediums of claim 38, wherein the instructions are further for re-enabling chain-select after processing a number of input bytes.

40. The one or more tangible, non-transitory computer-readable mediums of claim 28, wherein k=1.

* * * * *